United States Patent
Adducci et al.

(10) Patent No.: US 7,495,169 B2
(45) Date of Patent: Feb. 24, 2009

(54) NETWORK CABINET

(75) Inventors: Samuel J. Adducci, Palos Heights, IL (US); Christopher A. Dybek, Wyanet, IL (US); Bruce R. Appino, Wood Dale, IL (US); Max W. Hibner, Chicago, IL (US); Michael J. McGrath, New Lenox, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 11/876,023

(22) Filed: Oct. 22, 2007

(65) Prior Publication Data

US 2008/0036340 A1 Feb. 14, 2008

Related U.S. Application Data

(62) Division of application No. 11/467,956, filed on Aug. 29, 2006.

(60) Provisional application No. 60/781,923, filed on Mar. 13, 2006.

(51) Int. Cl.
*H02G 3/08* (2006.01)
(52) U.S. Cl. .................. 174/50; 174/59; 174/62; 174/54; 174/17 A; 312/265.1; 312/265.2; 312/223.1; 361/600; 361/796
(58) Field of Classification Search ............ 174/50, 174/59, 62, 17 R, 54, 58; 361/796, 724, 361/600, 601; 312/265.1, 265.2, 265.3, 265.4, 312/223.1; 220/4.02
See application file for complete search history.

(56) References Cited

U.S. PATENT DOCUMENTS

| | | | |
|---|---|---|---|
| 3,349,946 A | 10/1967 | Lee | |
| 4,825,339 A | 4/1989 | Boudon et al. | |
| 5,001,602 A | 3/1991 | Suffi et al. | |
| 5,391,084 A | 2/1995 | Kreitzman | |
| 5,402,515 A | 3/1995 | Vidacovich et al. | |
| 5,536,079 A | 7/1996 | Kostic | |
| 5,639,150 A * | 6/1997 | Anderson et al. | 312/265.3 |
| 5,640,482 A | 6/1997 | Barry et al. | |
| 5,695,263 A * | 12/1997 | Simon et al. | 312/265.4 |
| 5,758,002 A | 5/1998 | Walters | |

(Continued)

FOREIGN PATENT DOCUMENTS

DE 9311526 U1 9/1994

(Continued)

*Primary Examiner*—Dhiru R Patel
(74) *Attorney, Agent, or Firm*—Robert A. McCann; Christopher S. Clancy

(57) ABSTRACT

A network cabinet is provided including a base member, two pairs of vertical frame rail members connected to the base member, and a top cover supported by at least one of the vertical frame rail members. The base member defines an opening and another opening is defined in the top cover. The vertical frame rail members are positioned spaced apart from four sidewalls from four corners of the cabinet formed by the four sidewalls, where each sidewall includes a panel or a door. The two pairs of vertical frame rail members and the four sidewalls define at least one cable management pathway and at least a portion of the cable management pathway is vertically aligned with at least a portion of the opening of the base member and the opening of the top cover.

2 Claims, 40 Drawing Sheets

U.S. PATENT DOCUMENTS

| | | | |
|---|---|---|---|
| 5,825,962 A | 10/1998 | Walters et al. | |
| 6,036,290 A * | 3/2000 | Jancsek et al. | 312/265.4 |
| 6,044,193 A | 3/2000 | Szentesi et al. | |
| 6,102,214 A | 8/2000 | Mendoza | |
| 6,129,434 A | 10/2000 | Melane et al. | |
| 6,185,098 B1 | 2/2001 | Benavides | |
| 6,201,919 B1 | 3/2001 | Puetz et al. | |
| 6,238,029 B1 | 5/2001 | Marzec et al. | |
| 6,256,444 B1 | 7/2001 | Bechamps et al. | |
| 6,359,217 B1 | 3/2002 | Thompson et al. | |
| 6,381,393 B1 | 4/2002 | Matthews et al. | |
| 6,407,332 B1 | 6/2002 | Buckberger et al. | |
| 6,411,766 B1 | 6/2002 | Bechamps et al. | |
| 6,418,262 B1 | 7/2002 | Puetz et al. | |
| 6,424,781 B1 | 7/2002 | Puetz et al. | |
| D463,253 S | 9/2002 | Canty | |
| 6,443,542 B1 | 9/2002 | Lindquist et al. | |
| 6,467,633 B1 | 10/2002 | Mendoza | |
| 6,467,640 B1 | 10/2002 | Hung | |
| 6,468,112 B1 | 10/2002 | Follingstad et al. | |
| 6,487,356 B1 | 11/2002 | Harrison et al. | |
| 6,489,565 B1 | 12/2002 | Krietzman et al. | |
| 6,501,899 B1 | 12/2002 | Marrs et al. | |
| 6,502,702 B1 | 1/2003 | Hsue et al. | |
| 6,504,100 B2 | 1/2003 | Lawrence et al. | |
| 6,535,682 B1 | 3/2003 | Puetz et al. | |
| 6,556,763 B1 | 4/2003 | Puetz et al. | |
| 6,584,267 B1 | 6/2003 | Caveney et al. | |
| 6,600,107 B1 | 7/2003 | Wright et al. | |
| 6,605,782 B1 | 8/2003 | Krietzman et al. | |
| 6,613,981 B1 | 9/2003 | Hathcock et al. | |
| 6,614,665 B2 | 9/2003 | Witty et al. | |
| 6,614,978 B1 | 9/2003 | Caveney | |
| 6,708,830 B2 | 3/2004 | Mendoza | |
| 6,734,354 B2 | 5/2004 | McClellan et al. | |
| 6,760,531 B1 | 7/2004 | Solheid et al. | |
| 6,766,093 B2 | 7/2004 | McGrath et al. | |
| 6,785,459 B2 | 8/2004 | Schmidt et al. | |
| 6,796,437 B2 | 9/2004 | Krampotich et al. | |
| 6,850,685 B2 | 2/2005 | Tinucci et al. | |
| 6,884,942 B2 | 4/2005 | McGrath et al. | |
| 6,918,796 B2 | 7/2005 | Elliot et al. | |
| 6,946,605 B2 | 9/2005 | Levesque et al. | |
| 2001/0002657 A1 | 6/2001 | Mendoza | |
| 2004/0051426 A1 | 3/2004 | Krampotich | |

FOREIGN PATENT DOCUMENTS

| | | |
|---|---|---|
| DE | 10310283 B3 | 9/2004 |
| GB | 2366084 A | 2/2002 |
| WO | 0101534 A1 | 1/2004 |

* cited by examiner

NETWORK CABINET

CROSS-REFERENCE TO RELATED APPLICATIONS

This application is a divisional of U.S. application Ser. No. 11/467,956 filed Aug. 29, 2006, which claims priority to provisional patent application No. 60/781,923, filed Mar. 13, 2006.

FIELD OF INVENTION

This invention relates to network cabinets for cable connections and, more Particularly, to grounded cabinets for switching and patching applications.

BACKGROUND

There is a need for cabinets that provide cabinet access to the internal portions of the cabinet to install or modify cable connections and to provide less obtrusive ways to ground the cabinet, as well as other features that provide efficiencies and conveniences.

SUMMARY OF THE INVENTION

The present invention relates generally to an improved network cabinet.

In one embodiment, a network cabinet is provided comprising a base member, a vertical frame rail member connected to the base member, and an equipment rail. The vertical frame rail member is positioned spaced apart from at least two adjacent sidewalls and a corner of the cabinet formed by the two adjacent sidewalls, where each of the sidewalls comprises a panel or a door. The equipment rail is positionable into a spaced apart relationship with the vertical frame rail member.

In another embodiment, a network cabinet is provided comprising a base member and a pair of vertical frame rail members connected to the base member. The base member defines an opening, and the pair of vertical frame rail members are positioned spaced apart from at least two adjacent sidewalls and a corner of the cabinet formed by the two adjacent sidewalls, where each of the sidewalls comprises a panel or a door. The vertical frame rail members and one of the sidewalls define a cable management pathway and at least a portion of the cable management pathway is vertically aligned with at least a portion of the opening.

In another embodiment, a network cabinet is provided comprising a base member, a pair of vertical frame rail members connected to the base member, and a top cover supported by at least one of the vertical frame rail members. The vertical frame rail members are positioned spaced apart from at least two adjacent sidewalls and a corner of the cabinet formed by the two adjacent sidewalls, where each of the sidewalls comprises a panel or a door. The vertical frame rail members and one of the sidewalls define a cable management pathway and at least a portion of the cable management pathway is vertically aligned with at least a portion of an opening defined in the top cover.

In another embodiment, a network cabinet is provided comprising a base member, a vertical frame rail member connected to the base member, and at least one finger secured to and extending from the vertical frame rail member. The vertical frame rail member is positioned spaced apart from at least two adjacent sidewalls and a corner of the cabinet formed by the two adjacent sidewalls, where each of the sidewalls comprises a panel or a door.

In another embodiment, a network cabinet is provided comprising a base member, two pairs of vertical frame rail members connected to the base member, and a top cover supported by at least one of the vertical frame rail members. The base member defines an opening and another opening is defined in the top cover. The vertical frame rail members are positioned spaced apart from four sidewalls from four corners of the cabinet formed by the four sidewalls, where each sidewall comprises a panel or a door. The two pairs of vertical frame rail members and the four sidewalls define at least one cable management pathway and at least a portion of the cable management pathway is vertically aligned with at least a portion of the opening of the base member and the opening of the top cover.

BRIEF DESCRIPTION OF THE DRAWINGS

Certain embodiments of the present invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular embodiments illustrated herein.

DETAILED DESCRIPTION

Figure 1:
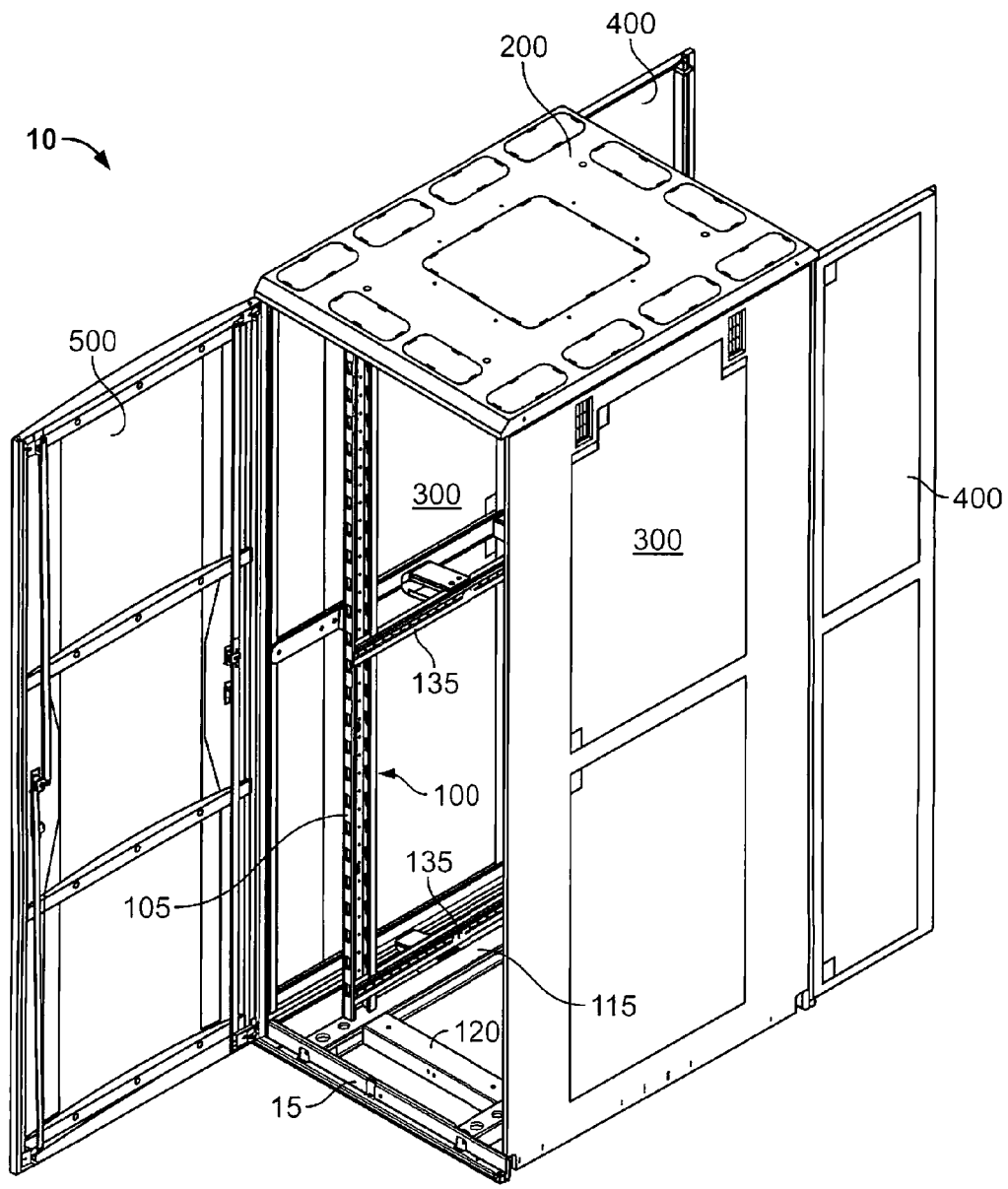
FIG. 1 is a front perspective view of the network cabinet of the present invention.

Referring to FIG. 1, one embodiment of a network cabinet 10 according to the present invention is shown. In the embodiment shown, the network cabinet generally includes a base frame 100, top cover 200, side panels 300, back doors 400, and front door 500. When fully assembled, the exemplary network cabinet is approximately 32 inches wide, 40 inches deep, and 84 inches high and has 45 rack units with a 2,000 pound load rating.

Figure 2A:
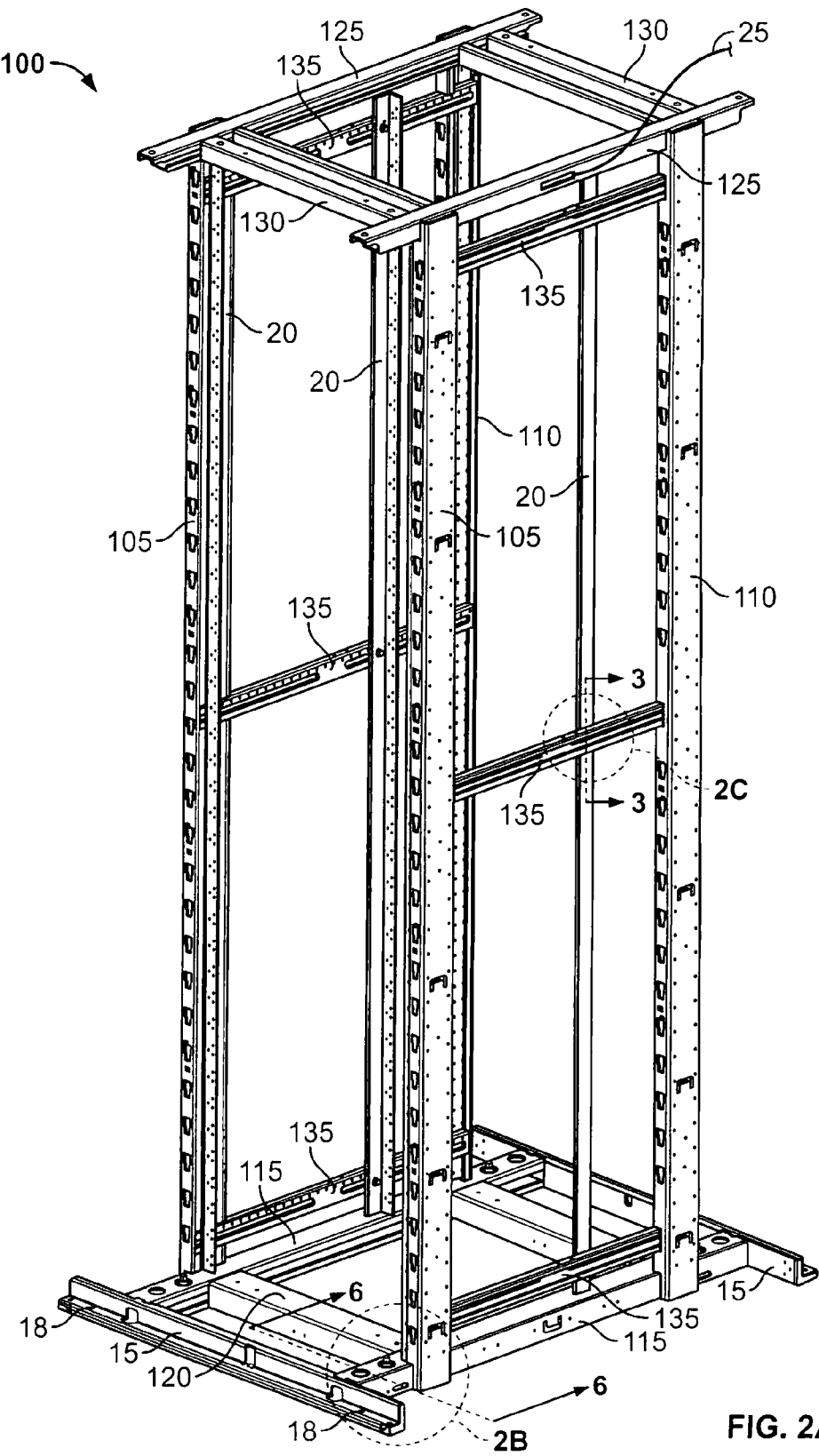
FIG. 2A is a front perspective view of the base frame of the network cabinet of the present invention.

Referring to FIG. 2A, an exemplary base frame 100 of the network cabinet 10 is shown. In this embodiment, the base frame 100 is conductive and generally includes a pair of front vertical frame rails 105, a pair of back vertical frame rails 110, a pair of front to back base beams 115, a pair of side to side base beams 120, a pair of front to back top beams 125, a pair of side to side top beams 130, and front to back support beams 135, all of which are typically steel but can be made of any suitable conductive or non-conductive material. As can be seen in FIGS. 1 and 2A and as described in more detail below, the front and back vertical frame rails 105, 110 are inset from side panels 300, back doors 400, front door 500, and the corners of the network cabinet 10 that are formed by side panels 300, back doors 400, and front door 500. This inset provides unobstructed space along all of the sides of the network cabinet 10 for cable management pathways.

In the embodiment shown, the side to side base beams 120 have a rectangular cross-section geometry and are positioned between and perpendicular to the front to back base beams 115, which also have a rectangular cross-section geometry. The side to side base beams 120 are welded to the front to back base beams 115 and, along with the door mounts 15, form a base member for the network cabinet and define openings 123, as seen in FIG. 2D as the cross-hatched areas. The front vertical frame rails 105 and back vertical frame rails 110 have a generally "C" shaped cross-section geometry and are positioned vertically on the front to back base beams 115 and welded to the front to back base beams 115. The space created by setting frame rails 105, 110 back from the side panels 300 provides cable management pathway between the frame rails 105, 110 and the side panels 300 when the network cabinet is fully assembled. The side to side top beams 130 have a generally "U" shaped cross-section geometry and are positioned between and perpendicular to the front to back top beams 125, which have a generally "C" shaped cross-section geometry. The side to side top beams 130 are welded to the front to back top beams 125 to form a support for the top cover and are supported by vertical frame rails 105, 110. The front to back top beams 125 are positioned at the top end of the front and back vertical frame rails 105, 110 and welded to the front and back vertical frame rails 105, 110. The front and back vertical frame rails 105, 110 are positioned so that they arc set back from the corresponding ends of the front to back base beams 115. The space created by setting the frame rails 105, 110 back from the ends of the front to back base beams 115 provides a cable management pathway between the frame rails 105, 110 and the front and back doors 500, 400 when the network cabinet is fully assembled.

In the embodiment shown, the front to back support beams 135 have a generally "C" shaped cross-section geometry, are positioned between and perpendicular to corresponding front and back vertical frame rails 105, 110, and are welded to the front and back vertical frame rails 105, 110. By welding together all of the steel components of the base frame 100, the base frame 100 is a single conductive, bonded unit. In this example, a ground whip 25 is bonded to front to back top beam 125 and is, in turn, connected at its opposing end to a main building ground. Ground whip 25 can also be attached to any other base frame 100 structural member to provide a single ground point for the base frame 100.

Figure 2B:
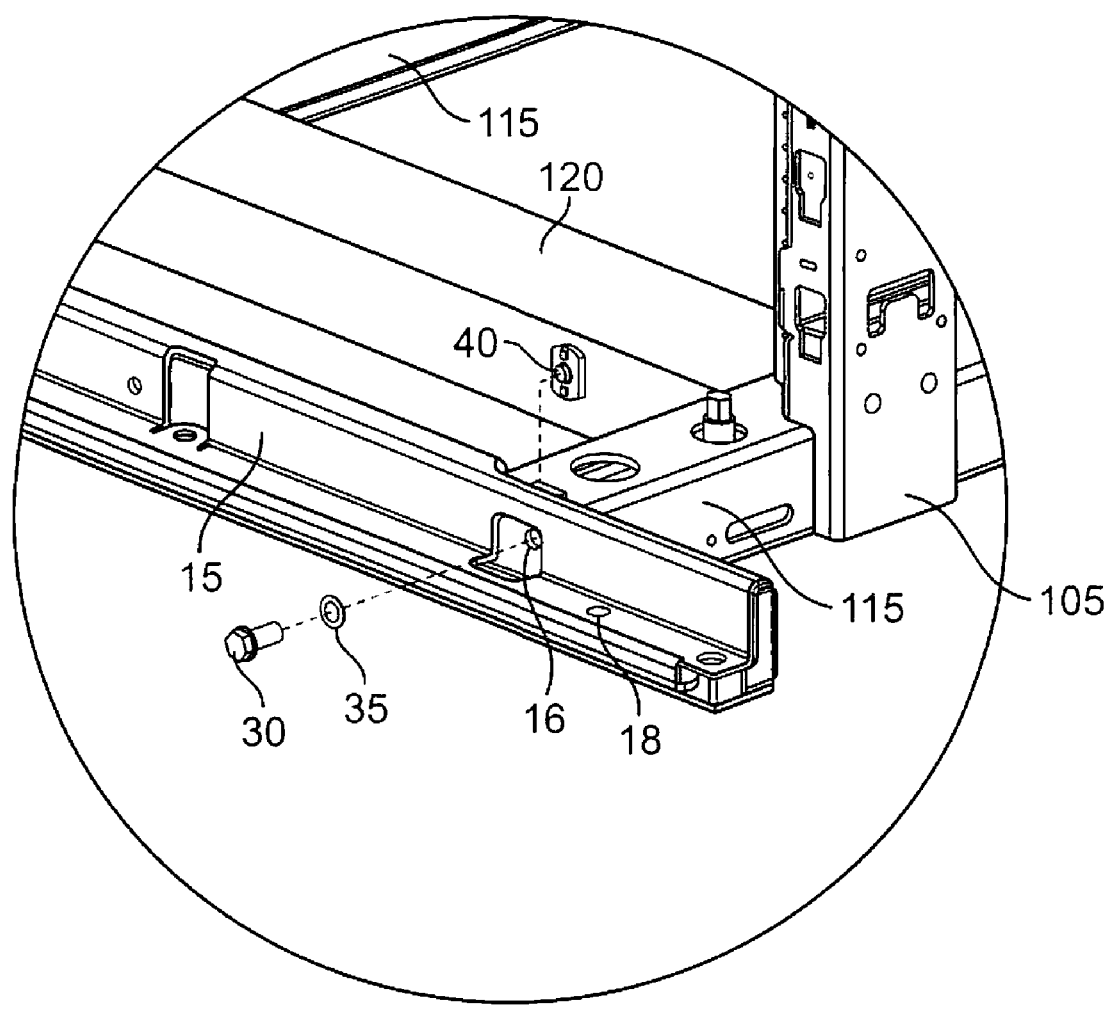
FIG. 2B is an enlarged partial exploded view of the front door mount and base frame shown in FIG. 2A.

Referring to FIGS. 2A and 2B, a pair of steel door mounts 15 are shown that have a generally "L" shaped cross-section geometry and are used to support the back and front doors 400, 500. Each door mount 15 is attached to an end of each front to back base beam 115 by bolts 30 that extend through holes 16 in the door mounts 15 and thread into nuts 40 that are welded to end caps (not shown), which are attached and bonded to the ends of the front to back base beams 115, such as by welding. In addition, as shown in FIG. 2B, at one of the two attachment points the door mount 15 is also bonded to the front to back base beam 115 by placing an internal tooth lock washer 35 between the bolt 30 and the door mount 15. The bolt 30 is inserted through the internal tooth lock washer 35 and through a hole 16 in the door mount 15 and is threaded into nut 40. The internal tooth lock washer 35 has teeth that pierce the paint or coating on the door mount 15 and bite into the metal of the door mount 15 to provide a ground path between the door mount 15 and the front to back base beam 115 through washer 35, bolt 30, and nut 40. An anti-oxidant paste could also be placed on the door mount 15, between the door mount 15 and lock washer 35, to prevent possible corrosion where the teeth of the lock washer 35 bite into the metal of the door mount 15. Alternatively, a regular washer could be used and the area around the hole 16 could be masked off or a serrated head bolt could be used in place of the bolt 30 and internal tooth lock washer 35 to similarly provide a bond between door mount 15 and front to back base beam 115 if bonding is desired.

Although the various elements of base frame 100 have been described above as having a particular geometry, being made of a particular material, and having particular connections, it will be understood that each of these elements could be made of varying geometries, varying materials, and connected by any suitable means as a particular application requires.

Figure 2C:
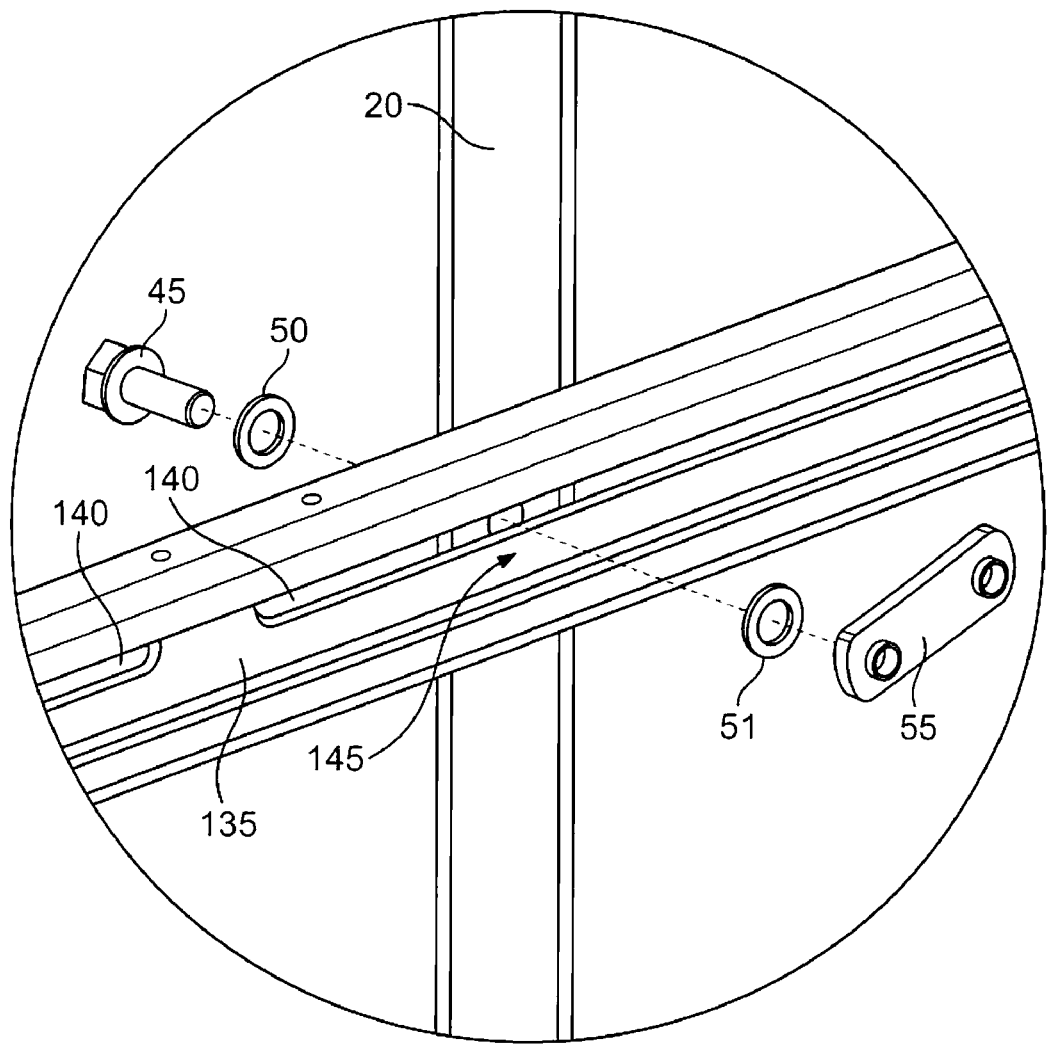
FIG. 2C is an enlarged partial exploded view of the adjustable equipment rail and base frame shown in FIG. 2A.
Figure 2D:
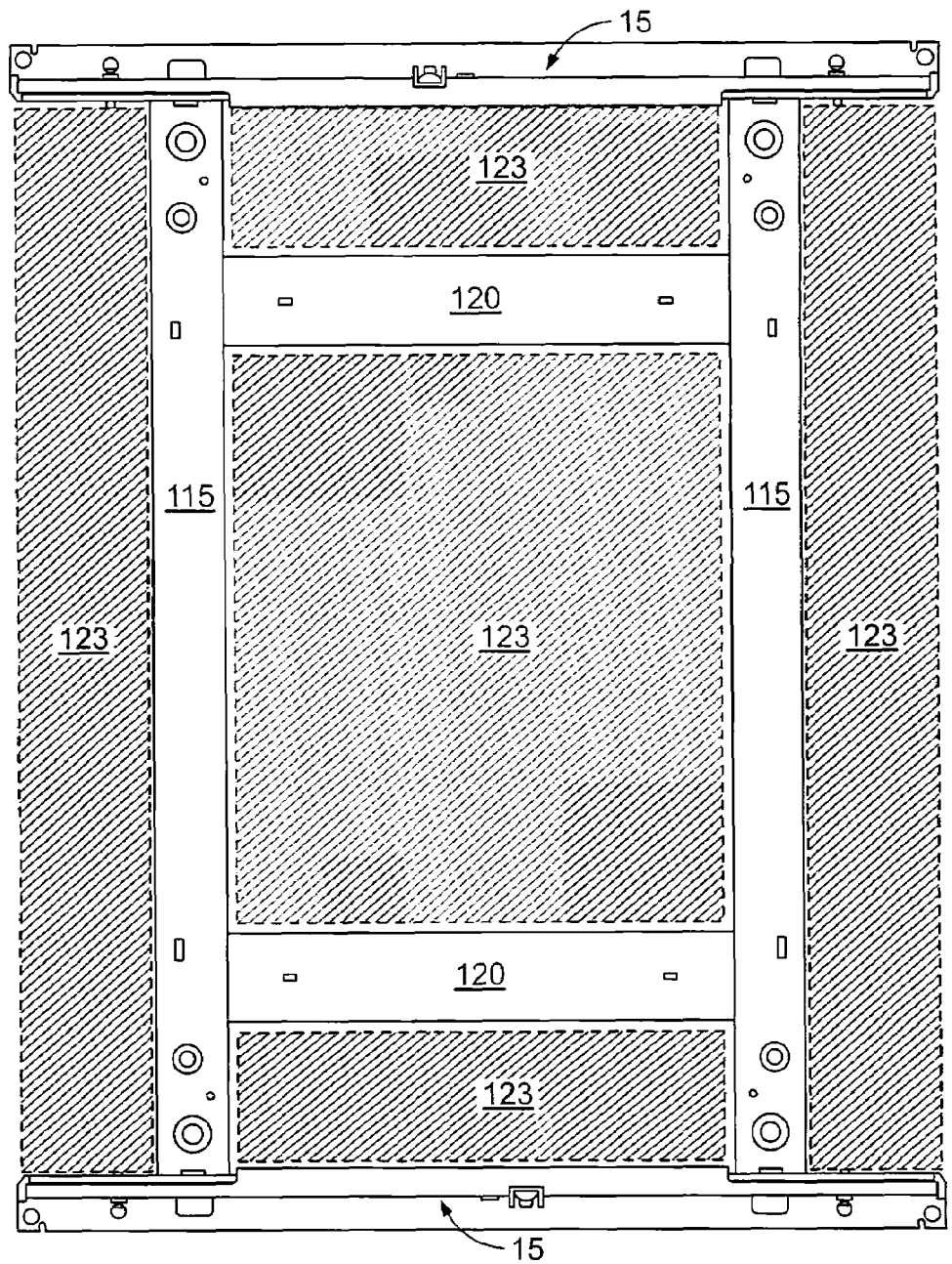
FIG. 2D is a top view of the base member of the network cabinet of the present invention.
Figure 3:
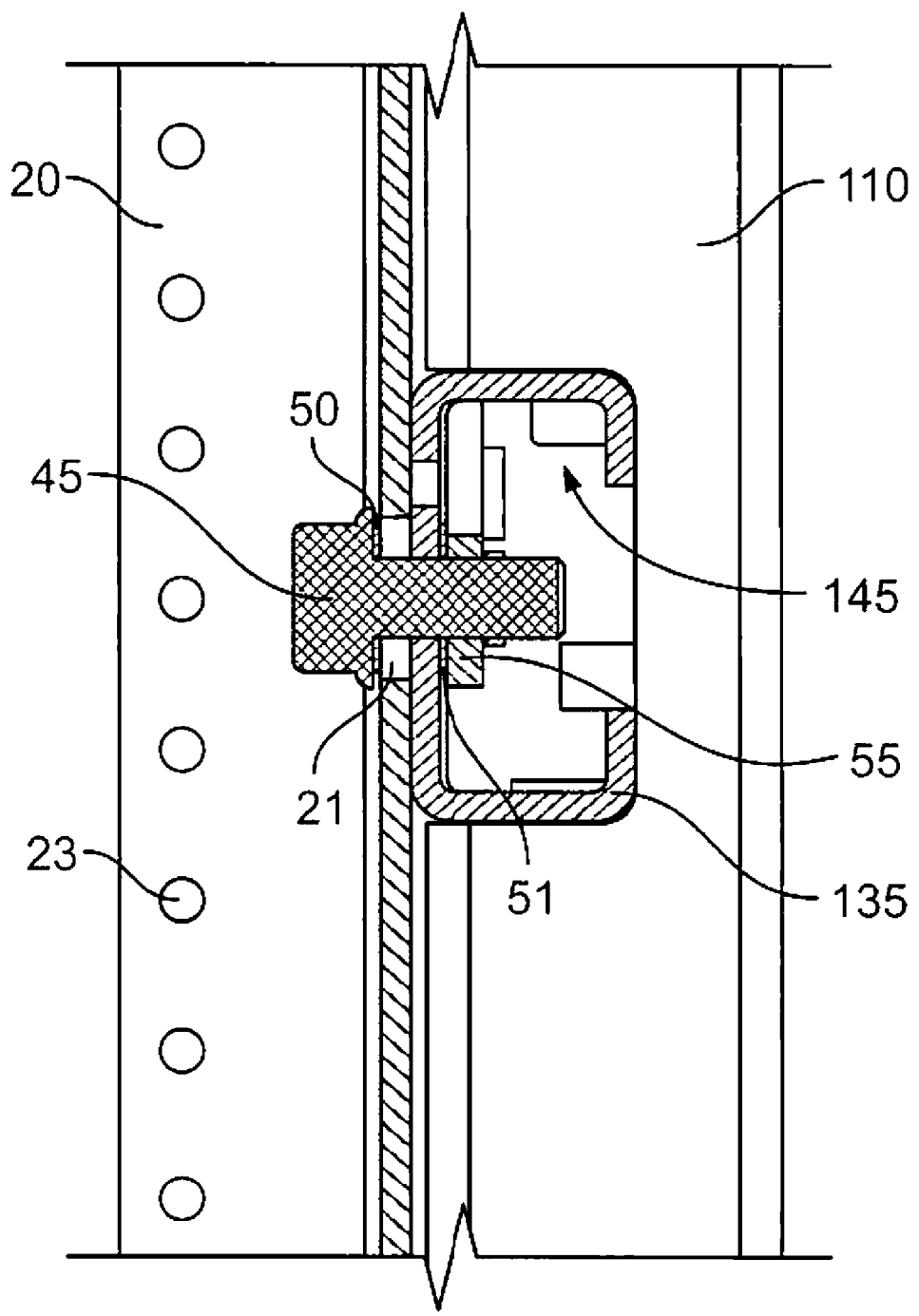
FIG. 3 is a cross-sectional view taken along line 3-3 in FIG. 2A.

Referring to FIGS. 2A, 2C, and 3, in this embodiment steel adjustable equipment rails 20 are shown that have a generally "L" shaped cross-section geometry and are used to mount equipment, such as patch panels, switches, or other network hardware equipment (not shown) in the network cabinet. Adjustable equipment rails 20 can also be made of other materials and have other geometries as required by a particular application. As can best be seen in FIG. 3, the equipment rails 20 each have a series of mounting holes 23 that are used to mount equipment to the equipment rails 20. In one example, the mounting holes 23 can be tapped holes that are threaded to accept a mounting bolt or screw (not shown) or in another example can be square holes that are adapted to accept a caged nut, which will then accept a mounting bolt or screw. In addition, as described in more detail below, the equipment rails 20 can be adjusted in relation to the frame rails 105, 110 by sliding them forward and backward along the front to back support beams 135. The equipment rails 20 enable equipment to be mounted at four points and in the exemplary network cabinet 10 can accommodate mounting depths of up to 25.9 inches.

Each equipment rail 20 can extend approximately from a front to back base beam 115 to the corresponding front to back top beam 125 and is connected to each of the three front to back support beams 135 which are each positioned at different elevations opposing sides of the base frame 100. In this embodiment, the equipment rails are connected to two of the front to back support beams 135 by inserting a bolt 45 through a hole 21 in one side of the equipment rail 20 and through a slot 140 (see FIG. 2C) in the front to back support beams 135 so that the threaded end of the bolt 45 extends into a channel 145 formed by the front to back support beams 135. A jam-nut 55 is positioned within the channel 145 and the bolt is threaded into the jam-nut 55. The jam-nut 55 here has an oblong configuration in which the length of the jam-nut 55 is greater than the width of the channel 145, thereby preventing rotation of the jam-nut 55 within the channel 145. The use of the jam-nut 55 allows the bolt 45 to be tightened without the need for a wrench or other tool to hold the nut securely within the channel 145. In addition, the use of bolt 45 and jam-nut 55 allows easy loosening of the connection between the adjustable equipment rails 20 and the front to back support beams 135, allowing for easy adjustment of the equipment rails 20 along front to back support beam 135.

In addition, as shown in FIGS. 2C and 3, in this embodiment at the third connection of equipment rail 20 to a front to back support beam 135, the connection is bonded by placing an internal tooth lock washer 50 between the bolt 45 and the equipment rail 20 and a second internal tooth lock washer 51 between the jam-nut 55 and the front to back support beam 135. The internal tooth lock washers 50, 51 have teeth that pierce the paint or coating and bite into the metal of the equipment rail 20 and front to back support beams 135. An anti-oxidant paste could also be placed on the equipment rail 20 and front to back support beam 135, underneath the lock washers 50, 51, to prevent possible corrosion where the teeth of the lock washers 50, 51 bite into the metal of the equipment rail 20 and front to back support beam 135. This provides a ground path from the equipment rail 20 to the front to back support beams 135 through the bolt 45, washers 50, 51, and jam-nut 55. This bonding makes adjustment of the equipment rails 20 more convenient since there are no jumper wires to disconnect and reconnect when the equipment rails 20 are moved. Alternatively, regular washers could be used and the area around the hole in the adjustable equipment rail 20 and the slot 140 in the front to back support beam 135 could be masked off or a serrated head bolt could be used in place of the bolt 45 and lock washer 50 if bonding is desired.

Figure 4A:
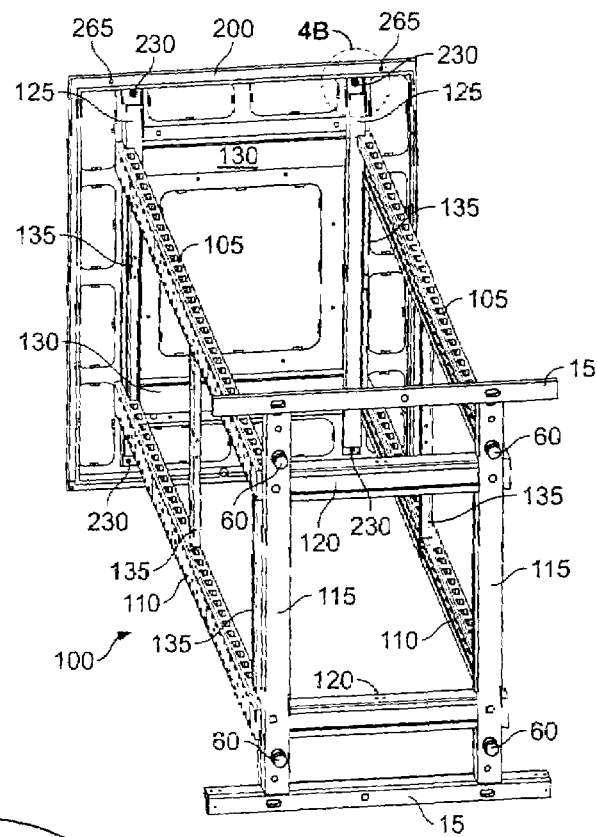
FIG. 4A is a bottom perspective view of the base frame of FIG. 2A and top cover of the network cabinet of the present invention.
Figure 4B:
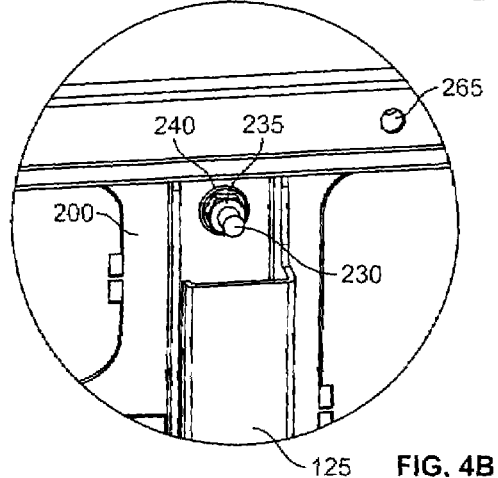
FIG. 4B is an enlarged partial view of the base frame and top cover shown in FIG. 4A.

Referring to FIGS. 4A and 4B, in this embodiment the top cover 200 is generally rectangular steel sheet having rolled over edges that is positioned on the front to back top beams 125 and side to side top beams 130 and secured to the front to back top beams 125. Four steel threaded members 230 are welded to the bottom side of the top cover 200 and extend from the bottom side of the top cover 200 such that they align with holes or slots (not shown) in the top surfaces of the front to back top beams 125. The threaded members 230 are aligned with and inserted into the holes in the front to back top beams 125 such that they extend through the holes. On three of the threaded members 230, hex nuts 235 are threaded onto the threaded members 230 to secure the top cover 200. On the fourth threaded member 230, the top cover 200 is also bonded to the front to back top beam 125 by placing an internal tooth lock washer 240 between the hex nut 235 and the front to back top beam 125. An anti-oxidant paste could also be placed on the front to back top beam 125, underneath the lock washer 240, to prevent possible corrosion where the teeth of the lock washer 240 bites into the metal of the front to back top beam 125. This provides a ground path from the top cover 200 to the front to back top beam 125 through the threaded member 230 hex nut 235, and lock washer 240. Alternatively, a regular washer could be used and the area around the hole in the front to back top beam 125 could be masked off or an internal tooth hex nut could be used in place of hex nut 235 and lock washer 240 if bonding is desired. In addition, top cover 200 could be constructed of any geometry and material and be connected via any means appropriate for a given application.

Figure 5B:
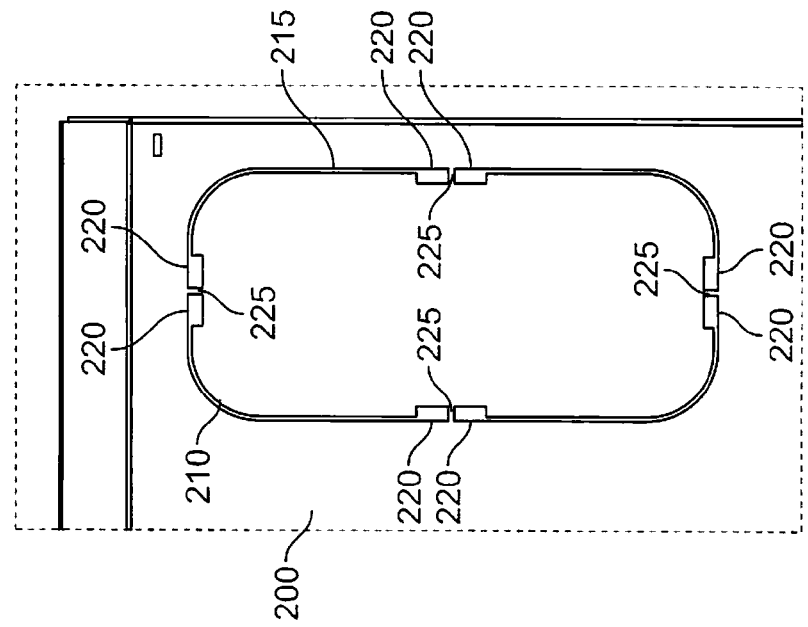
FIG. 5B is an enlarged partial view of a cable entry knockout shown in FIG. 5A.
Figure 5A:
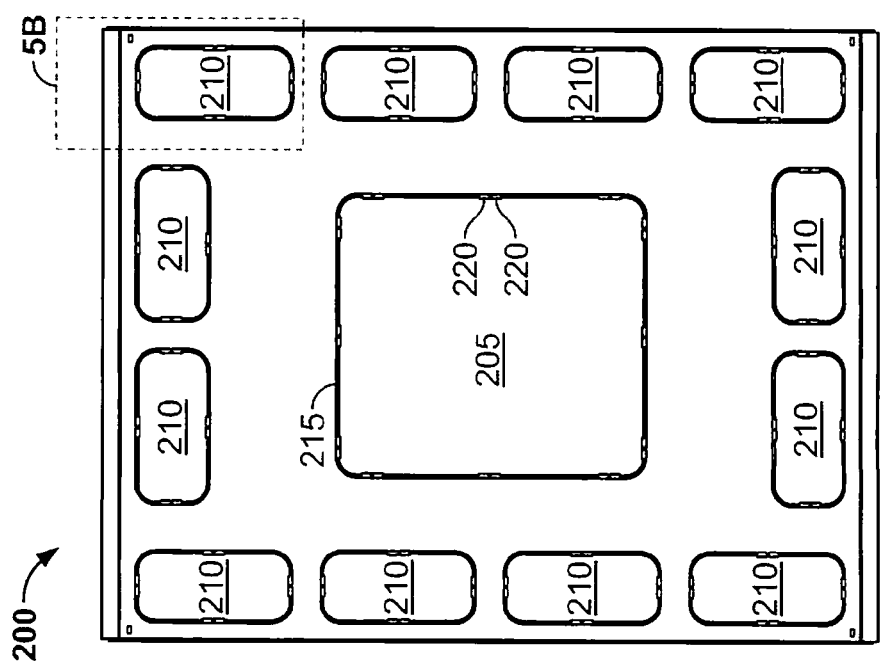
FIG. 5A is a top view of the top cover of the network cabinet of the present invention.

Referring to FIGS. 5A and 5B, the top cover 200 also has a center knockout 205 and multiple cable entry knockouts 210. The center knockout 205 can be removed to form an opening in top cover 200 to provide access to and ventilation for a fan mounted in the cabinet, for louvers, for cable entry, etc., and the cable entry knockouts 210 can be removed to form openings in top cover 200 to provide cable entry access in an over-head cable deployment application.

In this particular embodiment, each knockout 205, 210 is formed by cutting a slot 215 through the top cover 200 around the periphery of each knockout 205, 210. The slot 215 is cut almost completely around the periphery of each knockout 205, 210, except for the areas of the joining webs 225, which connect the main portion of the top cover 200 to the knockouts 205, 210 and hold the knockouts 205, 210 in place prior to removal. Each knockout 205, 210 has a minimum of four joining webs 225, as shown in FIG. 5B. The use of at least four joining webs 225 securely holds the knockouts 205, 210 in place in the installed position, whereas typical larger-size knockouts in sheet-metal components have been loosely held with only two joining webs and have been susceptible to inadvertent removal. In addition, at the end of each portion of the slot 215, there is an enlarged opening 220, which is sized to accept common hand tool cutters that can be used to cut the joining webs 225, which makes removal of the knockouts 205, 210 easier.

Figure 6:
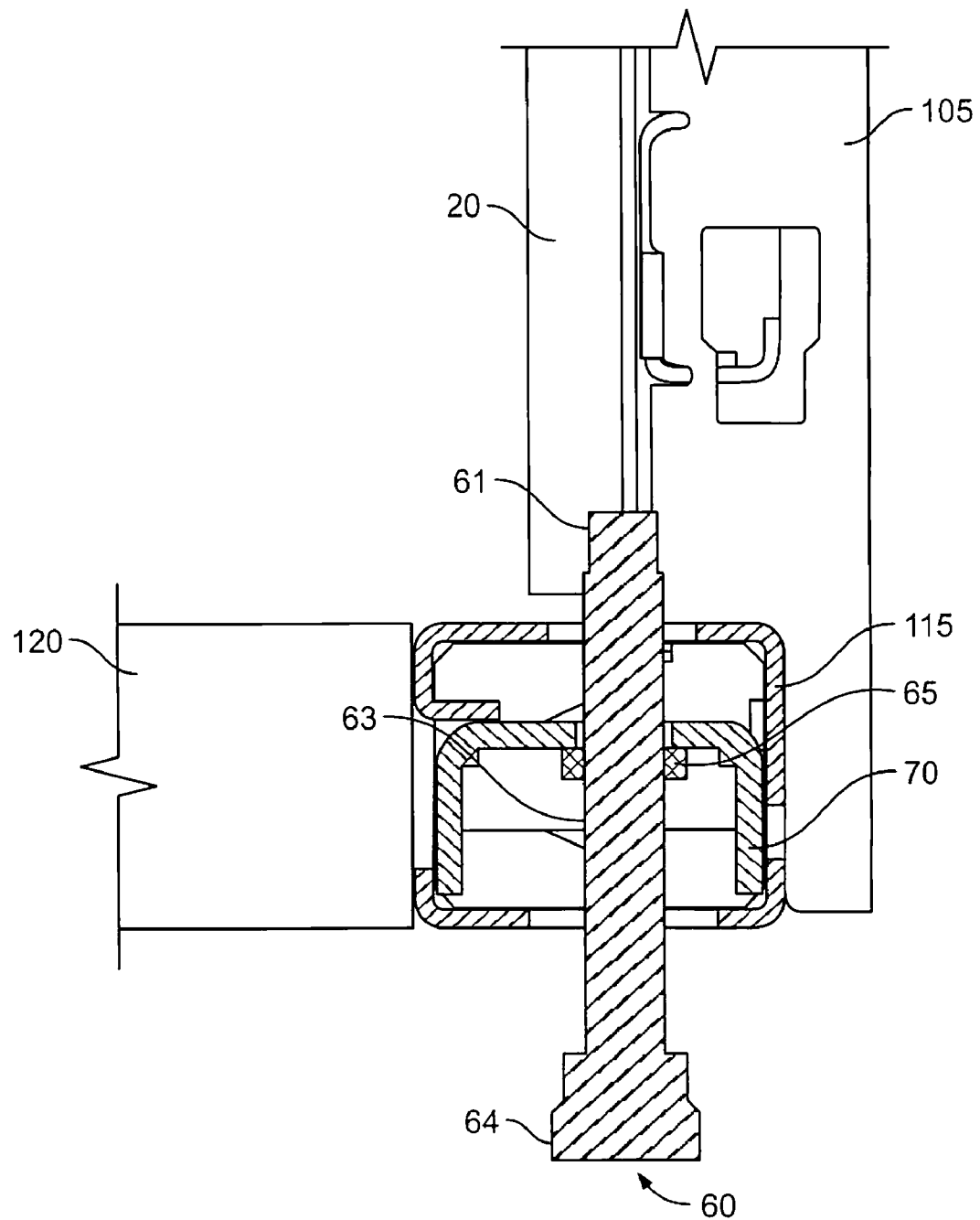
FIG. 6 is a cross-sectional view taken along line 6-6 in FIG. 2A.

Referring to FIGS. 4A and 6, four leveling legs 60 extend below the front to back base beams 115 to provide support and leveling capability for the network cabinet. As can best be seen in FIG. 6, in this embodiment each leveling leg 60 has a top portion 61 that extends through the top surface of the front to back base beam 115 and is accessible above the front to back base beam 115. The top portion 61 has a hexagonal or other cross-section that can be used with a socket wrench or other similar tool to raise and lower the leveling legs 60, as described below. Alternatively, the top portion 61 could be slotted so that it can be used with a screwdriver or other similar tool to raise and lower the leveling legs 60. Each leveling leg 60 also has a threaded body portion 63. The threaded body portion 63 is threaded through a nut 65 that is welded to a leveling leg support 70, which is attached and bonded to the front to back base beam 115, such as by welding. This secures the leveling leg 60 to the front to back base beam 115 and allows adjustment of the leveling leg 60, as discussed below. The foot 64 of the leveling leg is positioned below the front to back base beam 115 and is the portion of the leveling leg 60 that rests on the ground or floor to provide support.

With this construction, to adjust the height or level the network cabinet, a socket wrench or other similar tool is placed oil the top portion 61 and the leveling leg 60 is rotated. As the leveling leg 60 is rotated, the interaction of the threaded body portion 63 and the nut 65 will raise or lower the leveling leg 60 depending on the direction of rotation. In this fashion, adjustment of the height of the front to back base beam 115 off of the floor can be accomplished. Being able to access and rotate the leveling legs 60 from the top allows the leveling legs 60 to be easily adjusted without having to tip or move the network cabinet. It also assists with the installation/removal of optional casters, which is discussed in more detail below. Furthermore, when casters are not installed, the leveling legs 60 can be fully retracted into the front to back base beams 115 so that the front to back base beams 115 and side to side base beams 120 will sit on the ground and the cabinet load will be distributed.

Referring to FIGS. 7A, 7B, 8A, and 9, the side panels 300 in this embodiment are generally rectangular sheet steel that can be solid or perforated for aesthetics and air flow. Alternatively, rather than using a single side panel 300 per side of the network cabinet, multiple side panels could be used on each side and various geometries, materials, and designs could be used depending on the particular application. Here, the side panels 300 have hooks 305 attached to the bottom inside surface of the side panels 300 and latches 315 attached to the top of the side panels 300.

To mount the side panels 300, a bar 310 is attached between the front and back door mounts 15 by end brackets 312. The bar 310 is also supported near its center by center bracket 311, which is attached to the front to back base beam 115. As can best he seen in FIGS. 8A and 9, the hooks 305 are placed over the bar 310 to support the side panel 300 and the side panel 300 is aligned. The side panel 300 is then rotated into a vertical position and the latches 315 secure the side panel 300 to a side flange 202 of the top cover 200. Alternatively, the latches 315 can also have a locking assembly that allows the latches 315 to be locked into position once the side panels 300 have been mounted.

Figure 7A:
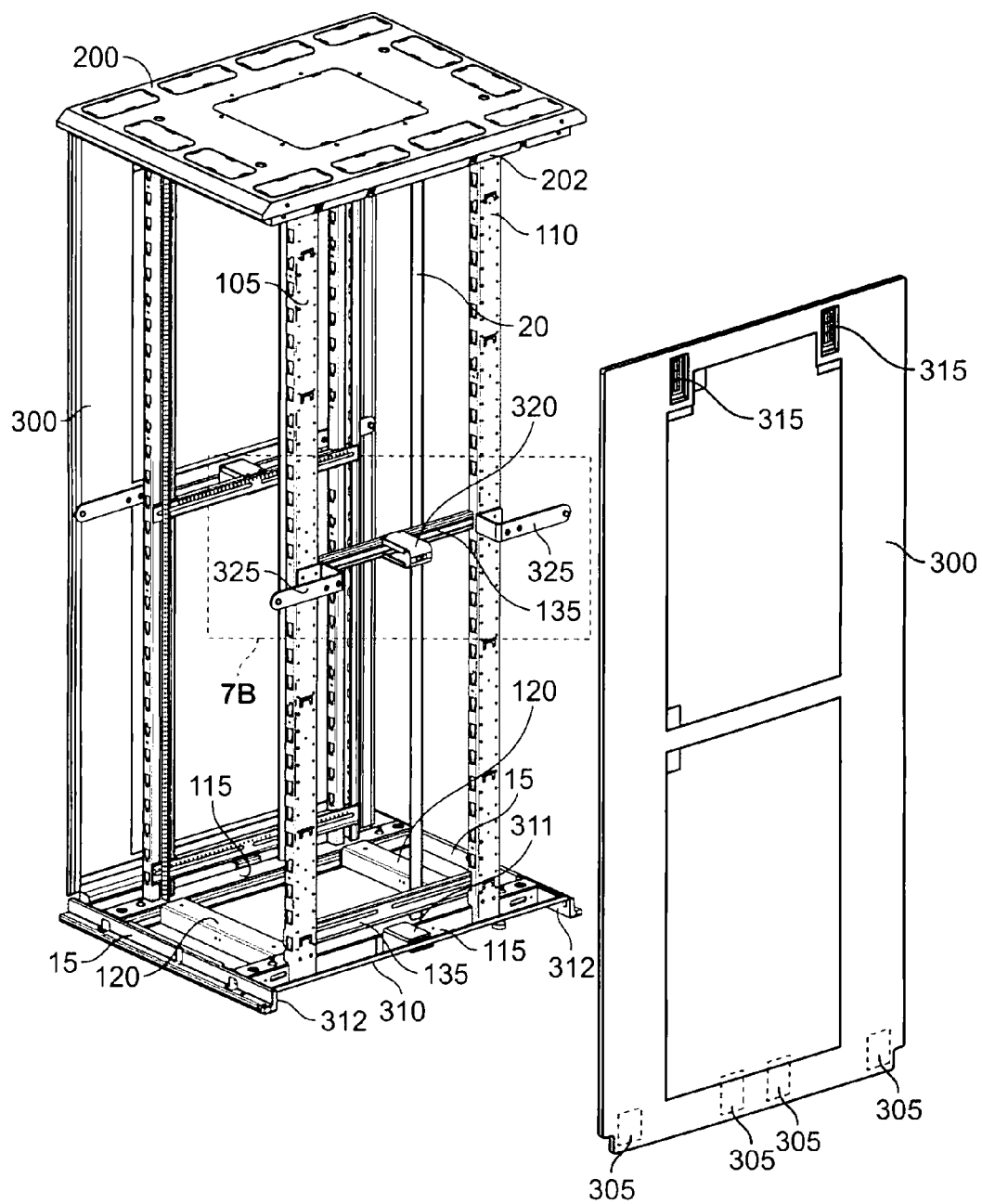
FIG. 7A is an exploded perspective view of the base frame, top cover, and side panels of the network cabinet of the present invention.
Figure 7B:
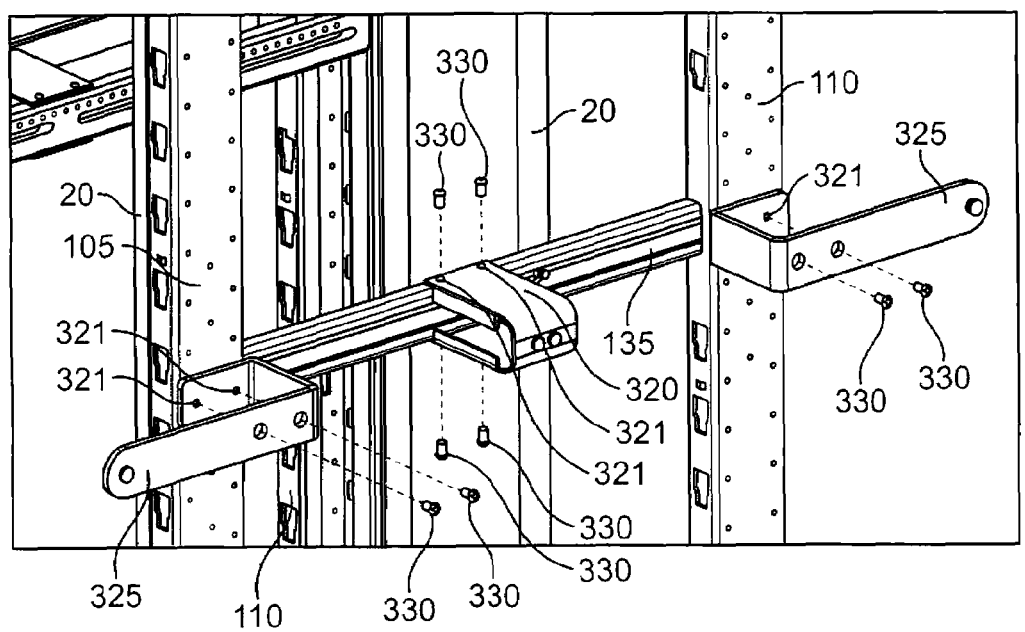
FIG. 7B is an enlarged partial exploded view of the base frame and side panel brackets shown in FIG. 7A.

As can best be seen in FIG. 7B, in this embodiment a center bracket 320 is attached and bonded to the center front to back support beam 135 and side brackets 325 are attached and bonded to a front vertical frame rail 105 and a back vertical frame rail 110. Trilobular screws 330 can be inserted through holes 321 in the brackets 320, 325 and threaded into the front to back support beam 135 and vertical frame rails 105, 110, securing the brackets 320, 325 to the front to back support beam 135 and vertical frame rails 105, 110. The trilobular screws 330 can also be used to bond to the front and back support beam 135 and vertical frame rails 105, 110 by cutting threads into the metal of the front to back support beam 135 and vertical frame rails 105, 110. An area around the holes 321 in the brackets 320, 325 is masked and left unpainted, thereby also bonding the trilobular screws 330 to the brackets 320, 325. Alternatively, rather than masking portions around the holes 321, a trilobular screw having teeth on the underside of the head that will cut into the metal of the brackets 320, 325 can be used if bonding is desired.

In this embodiment, the brackets 320, 325 provide support for the side panels 300 and offset the side panels 300 from the front and back vertical frame rails 105, 110 and front to back support rails 135, thereby providing easily accessible vertical cable management pathways between the side panels 300 and the front and back vertical frame rails 105, 100 and front to back support rails 135. In addition, brackets 325 on each side of bracket 320 provide a guide or channel for placing cables extending in a vertical direction within the cabinet and proximate to the respective corners of the cabinet. Alternatively, brackets 320, 325 could be removed if not needed for a particular application.

Figure 8A:
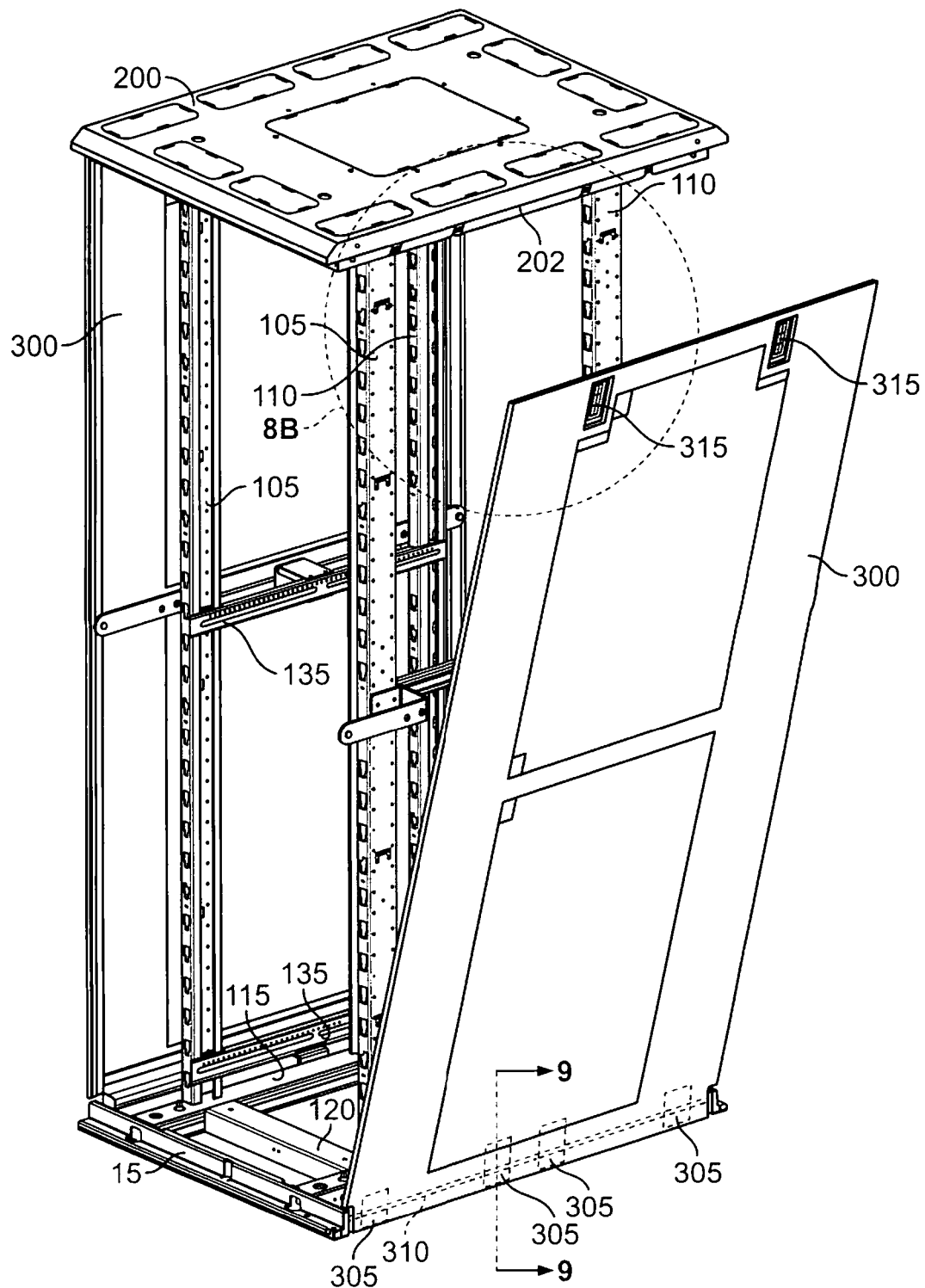
FIG. 8A is a perspective view of the base frame, top cover, and side panels of the network cabinet of the present invention, with one side panel partially installed.
Figure 8B:
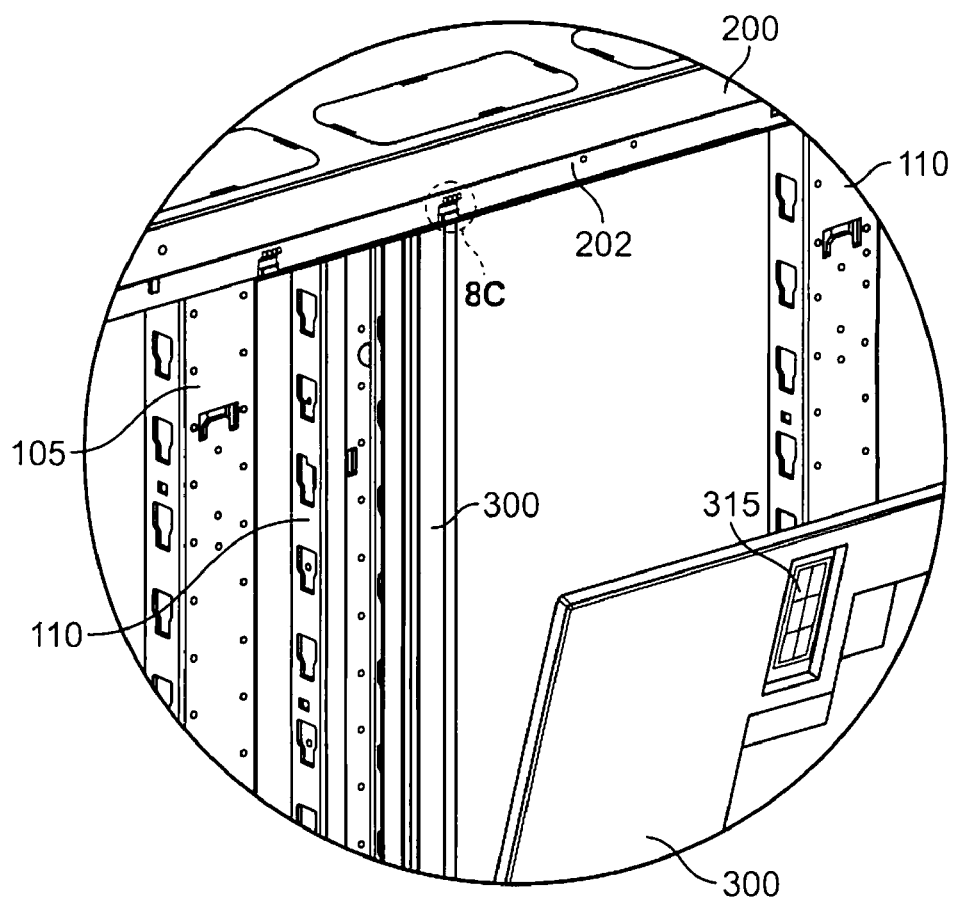
FIG. 8B is an enlarged partial view of the base frame, top cover, and side panel shown in FIG. 8A.
Figure 8C:
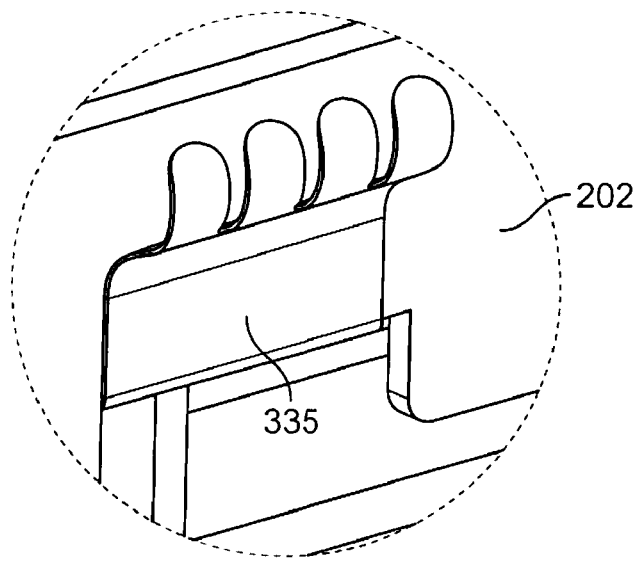
FIG. 8C is an enlarged partial view of the top cover and grounding clip shown in FIG. 8B.
Figure 9:
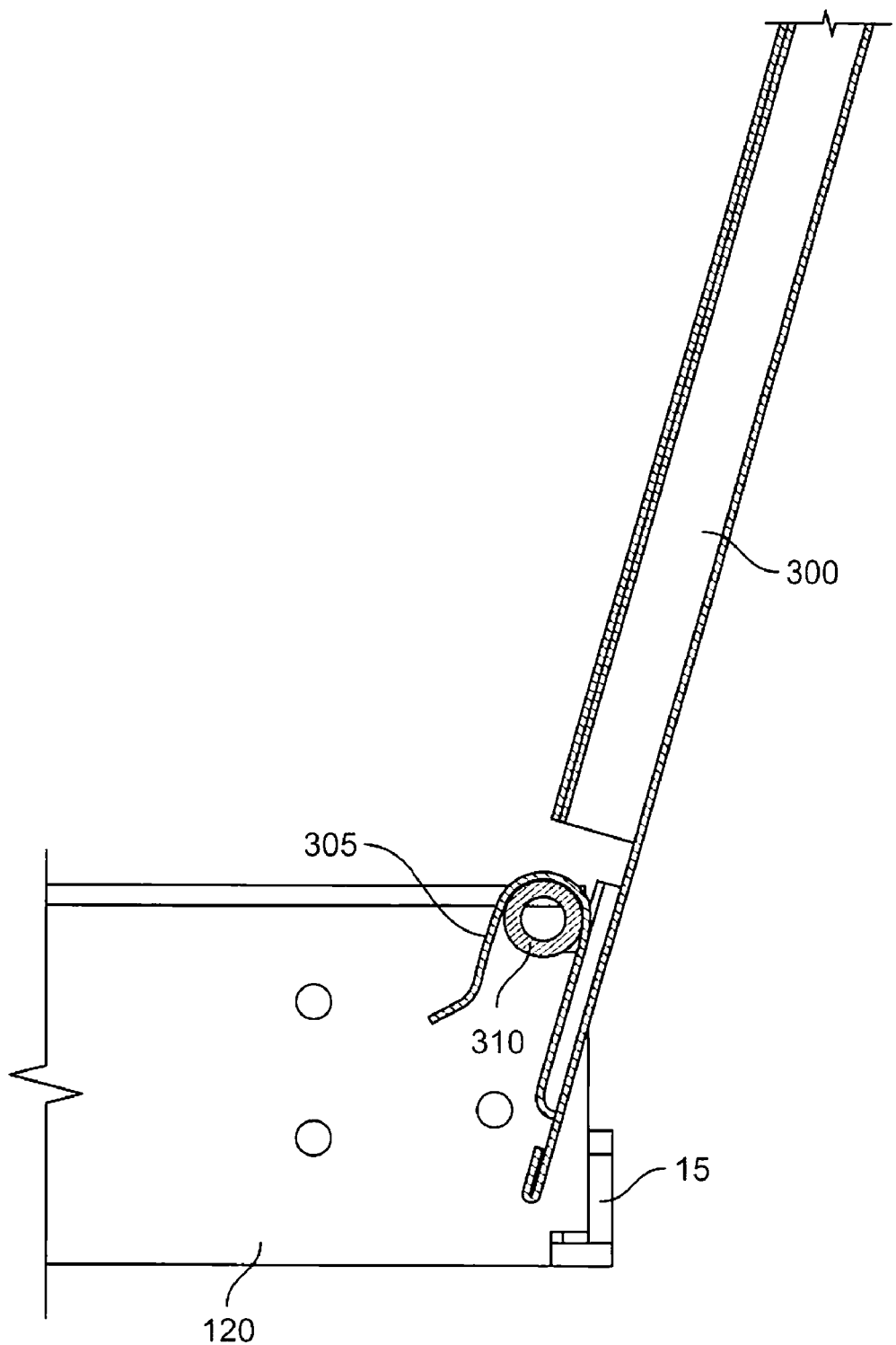
FIG. 9 is a cross-sectional view taken along line 9-9 in FIG. 8A.

Referring to FIGS. 8A, 8B, and 8C, in this embodiment the side panels 300 are bonded to top cover 200 through a grounding clip 335. The grounding clip 335 is attached to a masked, unpainted portion of the side flange 202 of the top cover 200. Each side panel 300 also has a masked, unpainted portion of the inside surface that contacts the grounding clip 335 and compresses the grounding clip 335 once the side panel 300 is latched in place. The contact of the grounding clip 335 with the masked, unpainted portions of the top cover 200 and side panel 300 bonds each side panel 300 to the top cover 200.

Alternatively, rather than using grounding clips 335 to bond the side panels 300 to the top cover 200, the side panels 300 could be bonded to the base frame 100 through the bar 310 and hooks 305. To provide bonding in this manner, one of the end brackets 312, which is welded to the bar 310, would be attached to a door mount 15 so that a bond is created and one of the hooks 305 would be attached to the side panel 300 so that a bond is created, such as by welding or the use of internal tooth lock washers, trilobular screws, paint masking, etc., as described throughout. A bond would then be created between the bar 310 and the bonded hook 305 by paint masking the bar 310 in the area that will contact the hook 305.

Figure 10A:
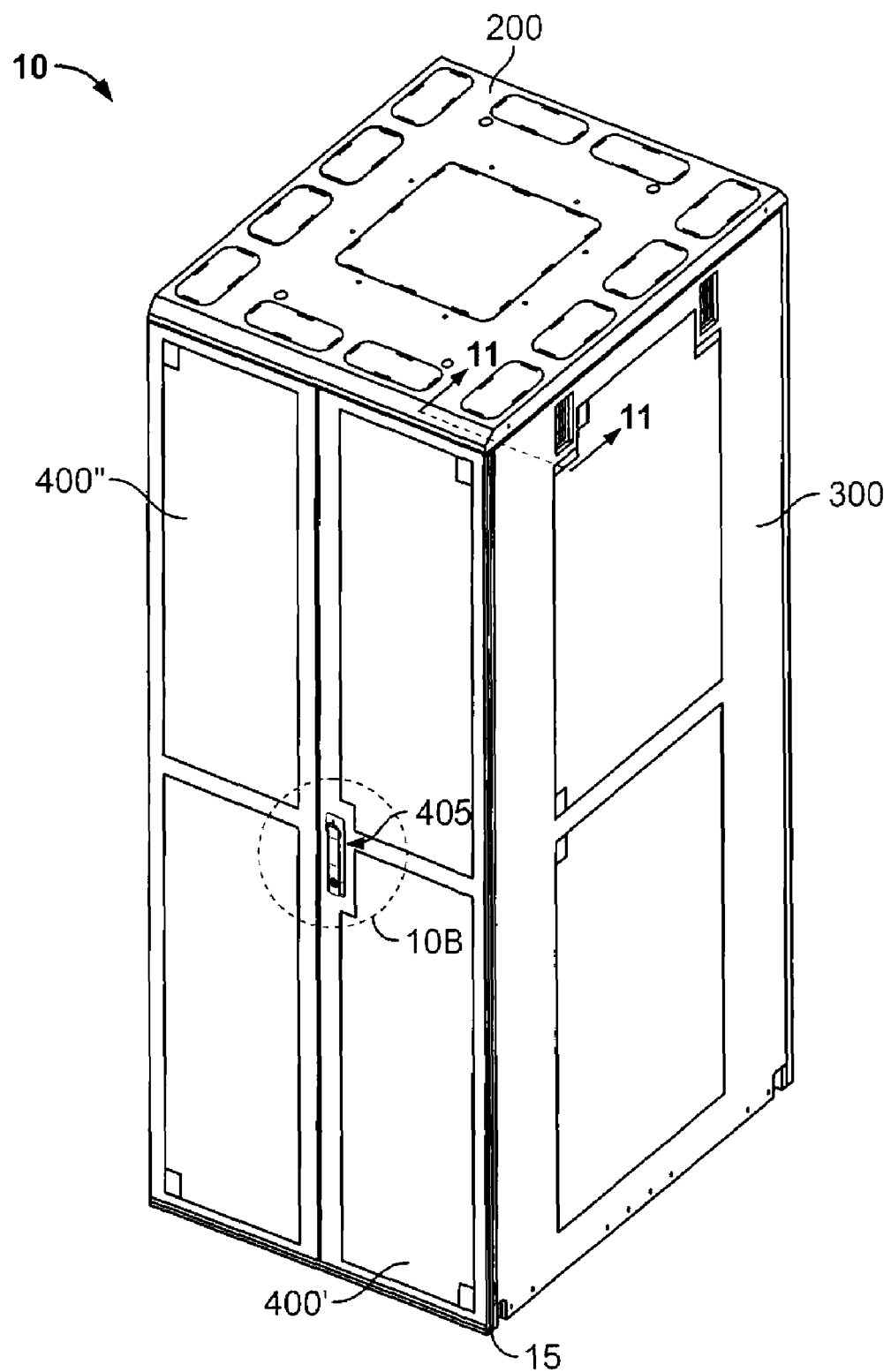
FIG. 10A is a back perspective view of the network cabinet of the present invention.

Referring to FIG. 10A, in this embodiment the back doors 400 are mounted to the back of the network cabinet 10 between the top cover 200 and the back door mount 15. In the example shown, the back doors 400 are split doors and are generally rectangular sheet steel that can be solid or perforated for aesthetics and air flow. Alternatively, rather than using split doors, a single back door or any other type of door having various geometries and being made of various materials could be used depending on the particular application. Here, each of the back doors 400 hinges open on pins at the top and bottom of the outside corners of the back doors 400.

Figure 10B:
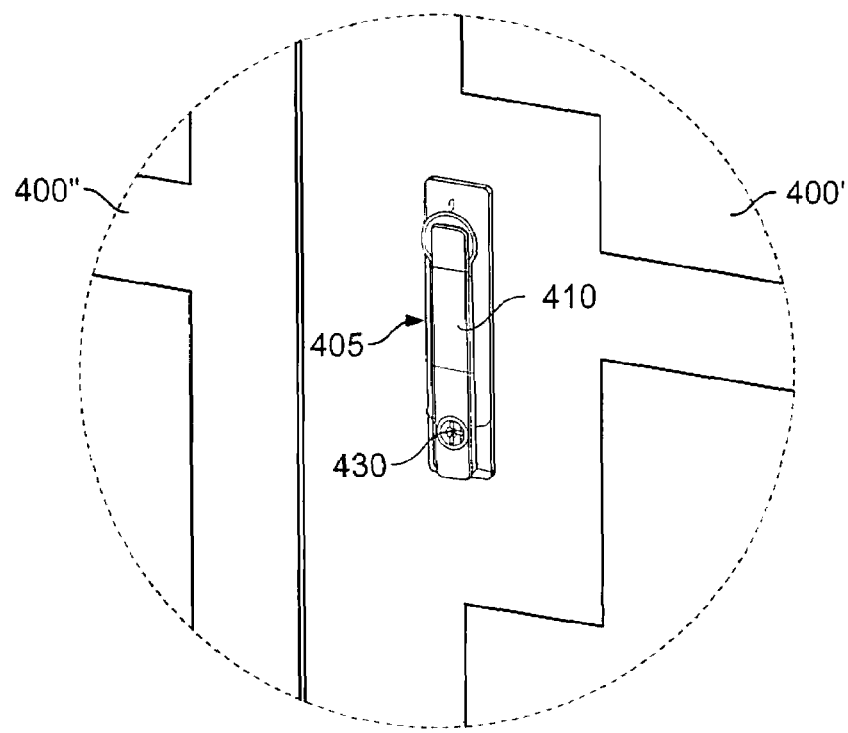
FIG. 10B is an enlarged partial view of the door handle shown in FIG. 10A.
Figure 10C:
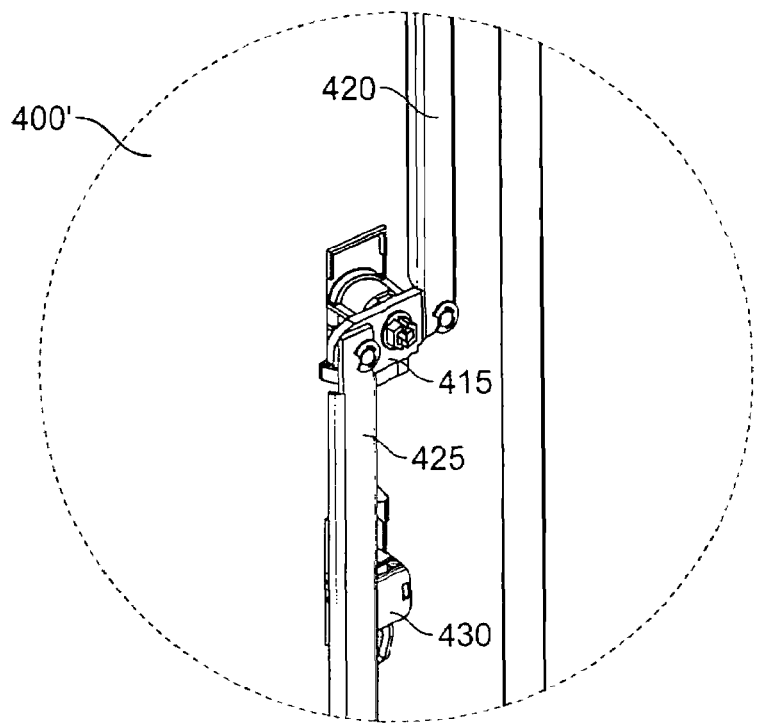
FIG. 10C is an enlarged partial view of the back of the door handle shown in FIG. 10B.

Referring to FIGS. 10A, 10B, and 10C, in the example shown, one of the back doors 400' has a latch mechanism 405 that secures the door to the top cover 200 and back door mount 15. The latch mechanism 405 has a door handle 410 that is accessible from the outside of the back door 400' and can also have a cylinder lock 430 that can lock the door handle 410 in the closed position. On the inside of the back door 400', the door handle 410 is connected to a cam plate 415 that can rotate as the door handle 410 is rotated. An upper rod 420 is attached to one end of the cam plate 415 and a lower rod 425 is attached to the other end of the cam plate 415, opposite the upper rod 420. The upper rod 420 extends generally vertically from the cam plate 415 up to the top cover 200 and the lower rod 425 extends generally vertically from the cam plate 415 down to the door mount 15. When in the closed position, the upper rod 420 extends into a hole in the top cover 200 and the lower rod 425 extends into a hole in the door mount 15, thereby securing the back door closed.

In the example shown in FIGS. 10A, 10B, and 10C, one of the back doors 400' has a latch mechanism 405 and the opposite back door 400" is overlapped by the back door 400' with the latch mechanism to hold it in the closed position. Alternatively, rather than overlapping both back doors 400', 400" could have latch mechanisms 405.

Figure 10D:
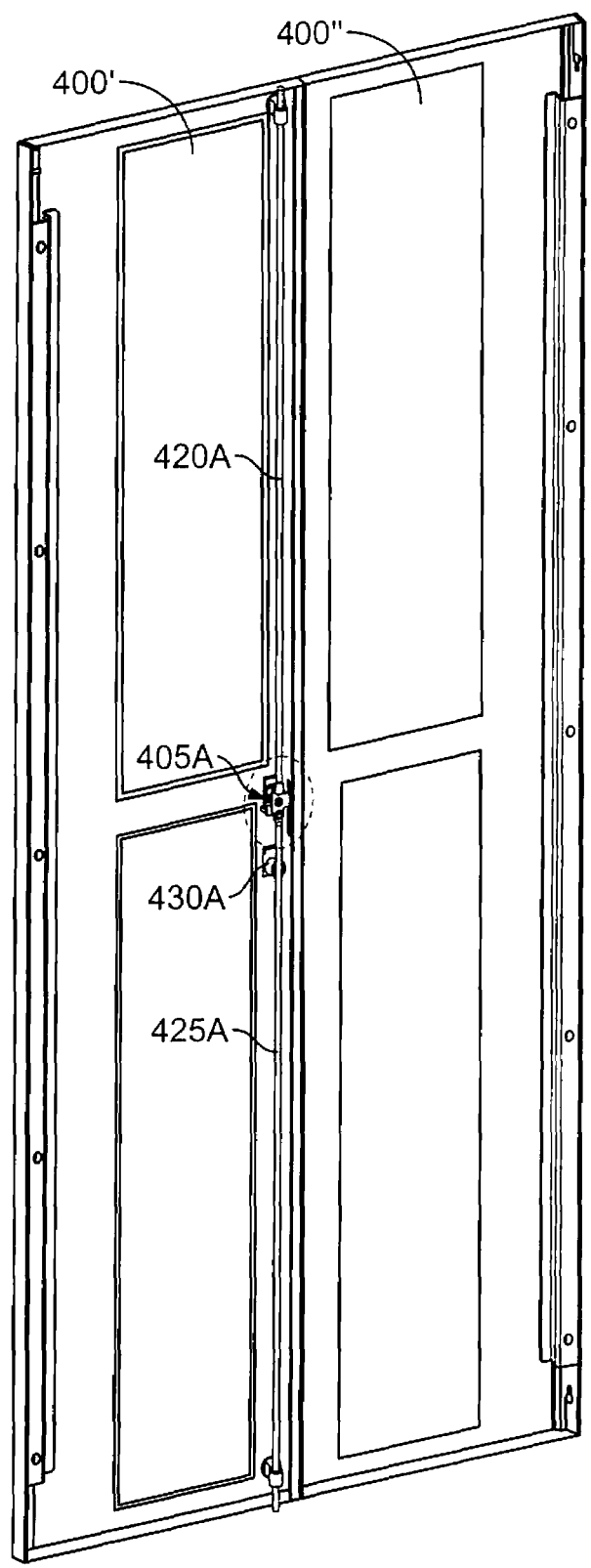
FIG. 10D is a back perspective view of the back doors of the network cabinet of the present invention with an alternative latch mechanism.
Figure 10E:
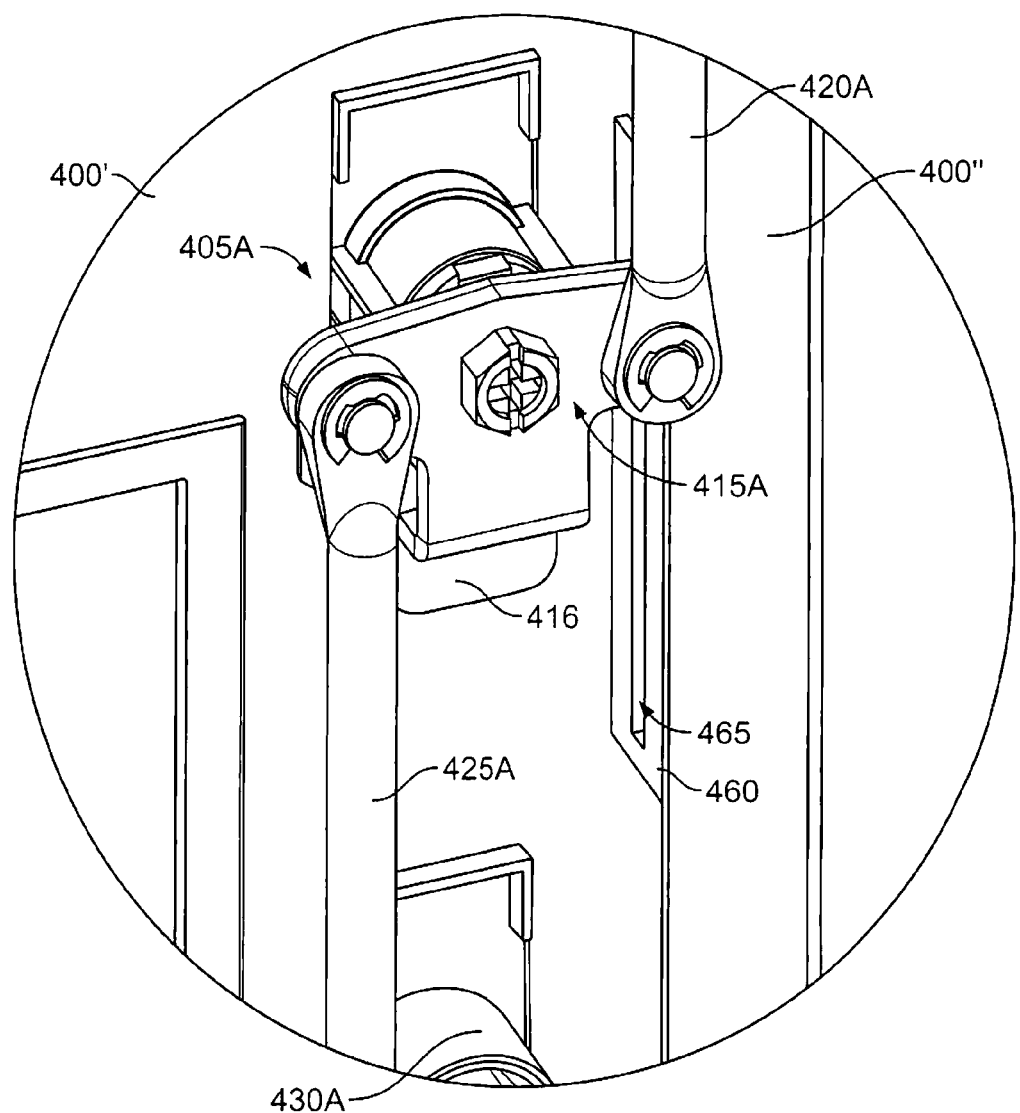
FIG. 10E is an enlarged partial view of the alternative latch mechanism shown in FIG. 10D in the open position.
Figure 10F:
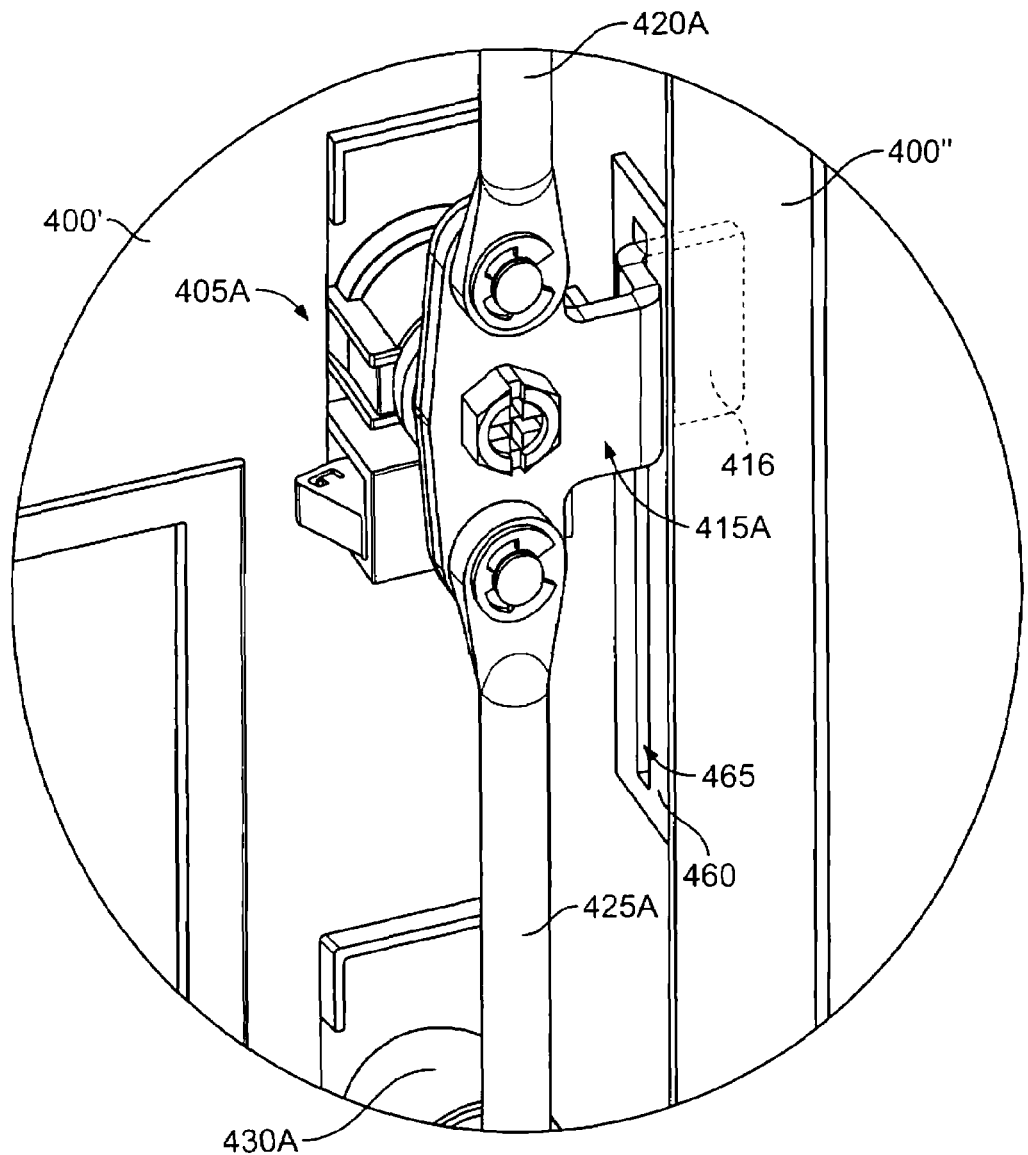
FIG. 10F is an enlarged partial view of the alternative latch mechanism shown in FIG. 10D in the closed position.

In another example, shown in FIGS. 10D, 10E, and 10F, one of the back doors 400' again has a latch mechanism 405A that secures the door to the top cover 200 and back door mount 15. The latch mechanism 405A has a door handle (not shown) that is accessible from the outside of the back door 400' and can also have a cylinder lock 430A that can lock the door handle in the closed position. On the inside of the back door 400', the door handle is connected to a cam plate 415A that can rotate as the door handle is rotated. An upper rod 420A is attached to one end of the cam plate 415A and a lower rod 425A is attached to the other end of the cam plate 415A, opposite the upper rod 420A. The upper rod 420A extends generally vertically from the cam plate 415A up to the top cover 200 and the lower rod 425A extends generally vertically from the cam plate 415A down to the door mount 15. When in the closed position, the upper rod 420A extends into a hole in the top cover 200 and the lower rod 425A extends into a hole in the door mount 15, thereby securing the back door closed.

Referring specifically to FIGS. 10E and 10F, in the example shown, the back doors 400', 400" still overlap to hold the second door 400" in the closed position, but also have an additional feature to provide extra security for the second door 400". In the example shown, cam plate 415A has a locking arm 416 that extends outward from and generally perpendicular to the axis of rotation of cam plate 515A and back door 400" has a plate 460 that includes a slot 465, which is configured to receive locking arm 416. Plate 460 can be a separate piece that is attached to back door 400", such as by welding or screws, or plate 460 can be integrally formed with back door 400". In addition, locking arm 416 can be shaped in a stair-step configuration towards the back door 400' to move locking arm 416 away from the inside of the network cabinet 10, which reduces the risk that locking arm 416 will pinch or catch cables or wiring that are in the cabinet 10.

As can be seen in FIG. 10E, when the latch mechanism 405A is in an open position, locking arm 416 extends downward and does not engage slot 465 and the back doors 400', 400" can be opened. Conversely, as can be seen in FIG. 10F, when the latch mechanism 405A is moved to a closed position, locking arm 416 rotates until it is generally horizontal and engages slot 465. When in this position, the back door 400" is secured by the overlap of back door 400' over back door 400" and also by the engagement of locking arm 416 with slot 465.

Figure 11:
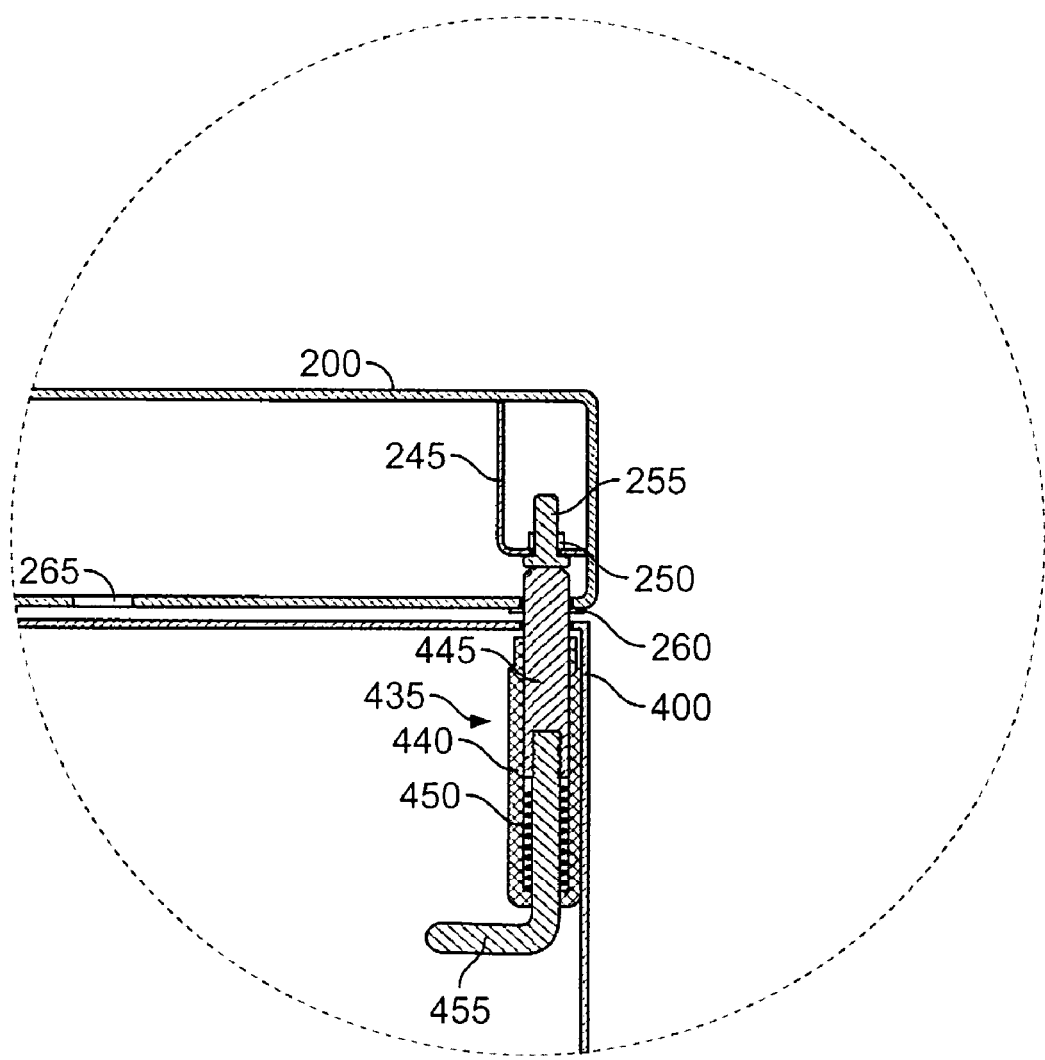
FIG. 11 is a cross-sectional view taken along line 11-11 in FIG. 10A.

Referring to FIG. 11, each of the back doors 400 can be bonded to the top cover 200 through a spring loaded hinge assembly 435, which includes a generally cylindrical body 440, hinge pin 445, release arm 455, and spring 450. The body 440 is steel, or other conductive material, and is welded to the inside surface of the back door 440. The hinge pin 445 is steel, or other conductive materials and is positioned inside the body 440. The release arm 455 is generally "L" shaped, extends through a hole in the end of the body 440, and threads into the hinge pin 445. Spring 450 is positioned inside of the body 440 and is compressed between the hinge pin 445 and the end of the body 440. Spring 450 biases the hinge pin 445 outward from the body 440 and allows the hinge pin 445 to be retracted when the release arm 455 is pulled. Hinge pin 445 extends from the end of the body 440, through a hole in the top of the back door 400 and through bushing 260 in top cover 200, where hinge pin 445 contacts a thread forming screw 255 that is bonded to the top cover 200.

To bond the thread forming screw to the top cover 200, a conductive ground angle 245 is welded to the inside surface of the top cover 200 and the thread forming screw 255 is threaded into the ground angle 245 and into a nut 250 that is welded to the ground angle 245, thereby providing a bond between the top cover 200 and the screw 255.

To install or remove the back door 400, the release arm 455 is pulled downward, which compresses the spring 450 and retracts the hinge pin 445 into the body 440. With the hinge pin 445 below the level of the bushing 260, the back door 400 can be placed in position or removed. Once the back door 400 is in position, the release arm 455 is released and the spring 450 pushes the hinge pin 445 outward through the bushing 260 until the hinge pin 445 contacts the screw 255.

In this example, the spring loaded hinge assembly 435 provides the hinge mechanism for the back door 400 and also provides a positive grounding path when the back doors 400 are installed. This allows the removal of the back doors 400 without the need of disconnecting any grounding jumper wires.

Referring to FIGS. 2A and 2B, in this example the door mounts 15 also have holes 18 that are inset from the bushings 600 that receive the bottom fixed hinge pin for the back doors 300. Although FIGS. 2A and 2B show the door mount 15 for the front door 500, the two door mounts 15 are mirror images of each other and the door mount 15 for the back doors 400 contains identical holes 18. Referring to FIGS. 4A, 4B, and 11, the top cover 200 has holes 265 that are inset from the bushings 260 that receive the hinge pin 445 of the spring loaded hinge mechanism 435. Each of the holes 18 in the door mounts 15 is aligned in a generally vertical axis with a corresponding hole 265 in the top cover 200 and provides a storage mechanism for a back door 400 that has been removed.

For example, as described above, a back door 400 can be removed by pulling downward on the release arm 455, which retracts the hinge pin 445 and allows the back door 400 to be tilted and removed. Rather than having to lean the removed back door 400 on the cabinet 10 or against a wall or other equipment where it can be bumped into or knocked over, the removed back door 400 can be stored using holes 18 and 265 in the door mount 15 and top cover 200. To store the removed back door 400, the opposite back door is opened, the fixed hinge pin on the bottom of the removed back door 400 is inserted into the hole 18 in the door mount 15 nearest the bushing 600 of the open back door, and the hinge pin 445 of the spring loaded hinge mechanism 435 is inserted into the corresponding hole 265 in the top cover 200 by pulling downward on the release arm 455.

Figure 12A:
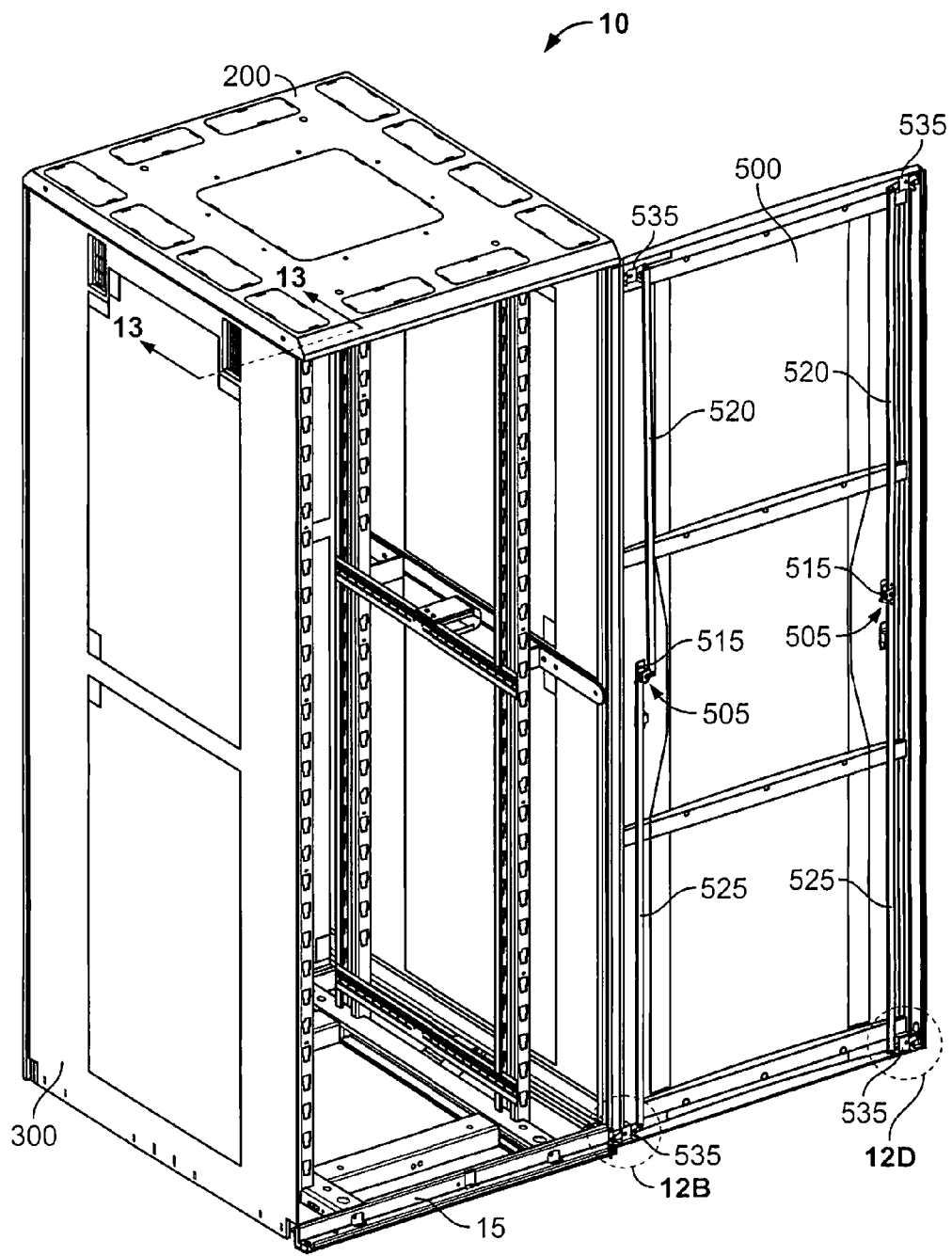
FIG. 12A is a front perspective view of the network cabinet of the present invention, with the front door partially open.

Referring to FIG. 12A, in this embodiment front door 500 is mounted to the front of the network cabinet 10 between top cover 200 and the front door mount 15. In the example shown, the front door 500 is generally rectangular sheet steel that can be solid or perforated for aesthetics and air flow, is dual hinged, as described in more detail below, and can be opened from either the left or right side giving full access to either the left or right rack and vertical cable management channels without having to remove front door 500. Alternatively, rather than using a single dual hinged door, split doors, a single hinged door, or any other type of door could be used as well and front door 500 could be made of any geometry and of any material and design as required for a particular application.

Figure 19:
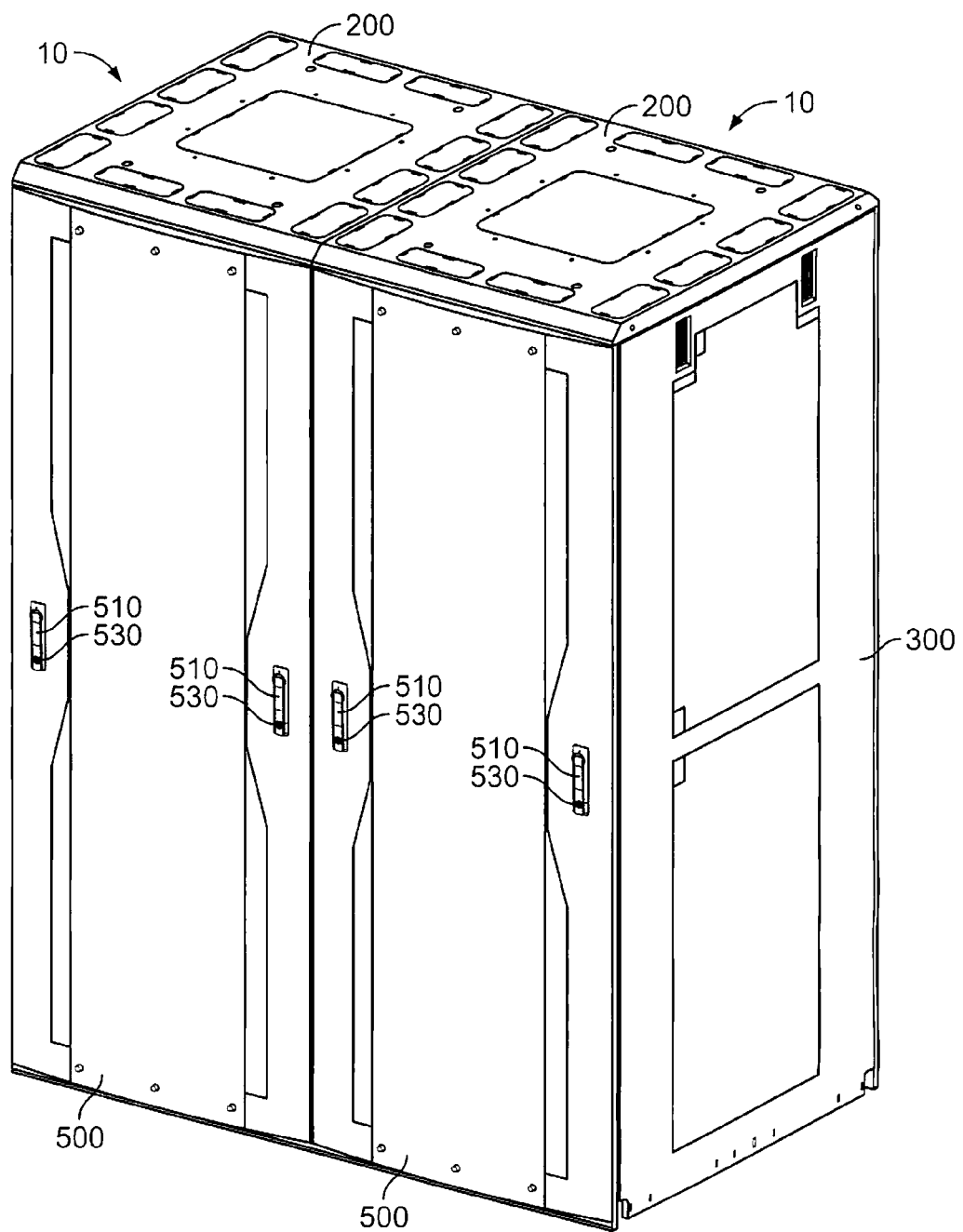
FIG. 19 is a front perspective view of two network cabinets ganged together.

Referring to FIG. 12A, in this example, front door 500 has two latch mechanisms 505, one on each side of the front door 500. The latch mechanisms 505 have a door handle 510 (as shown in FIG. 19), cam plate 515, upper rod 520, and lower rod 525, and are substantially identical in operation to the latch mechanism 405 described above for the rear doors 400 (see FIGS. 10B and 10C). The latch mechanisms 505 can also have a cylinder lock 530 (as shown in FIG. 19), which can lock the door handle 510 in the closed position.

Figure 12B:
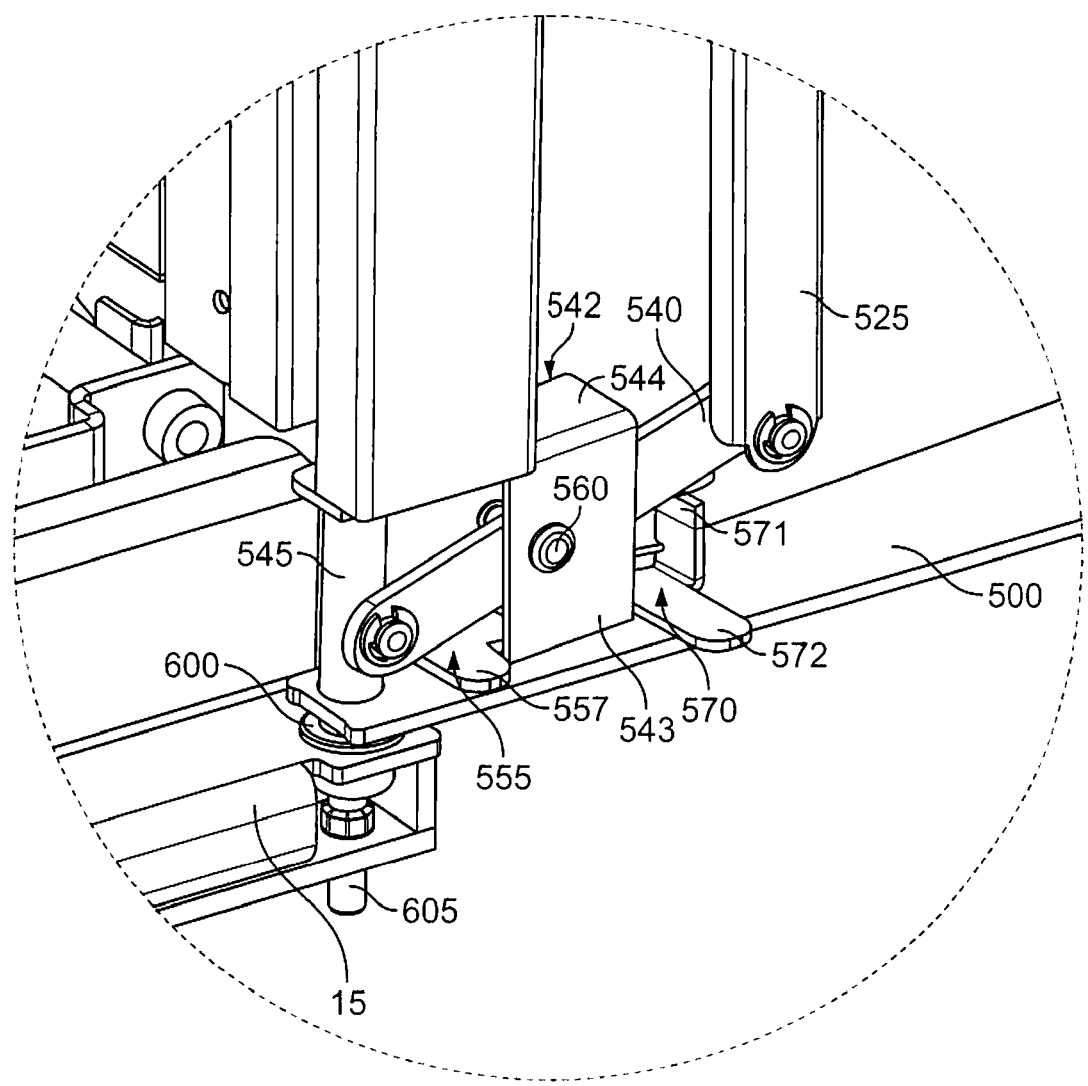
FIG. 12B is an enlarged partial view of a safety hinge of the front door shown in FIG. 12A.
Figure 12C:
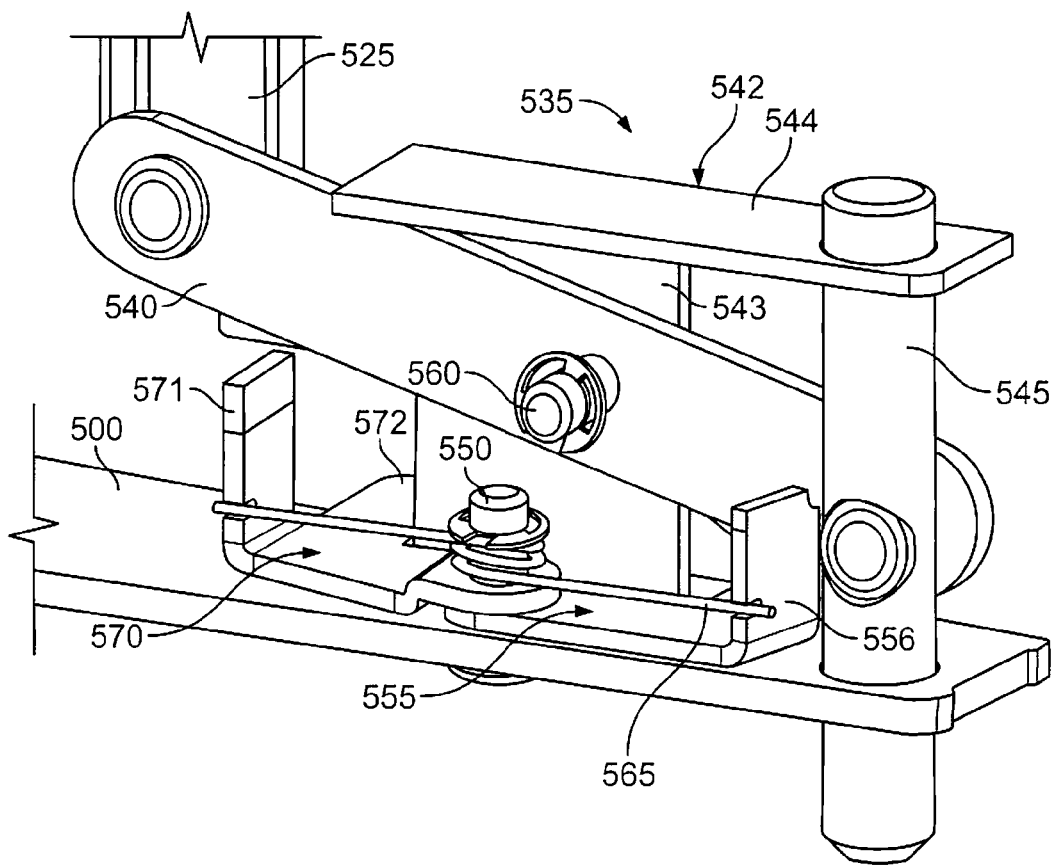
FIG. 12C is a back view of the safety hinge in FIG. 12B.
Figure 12D:
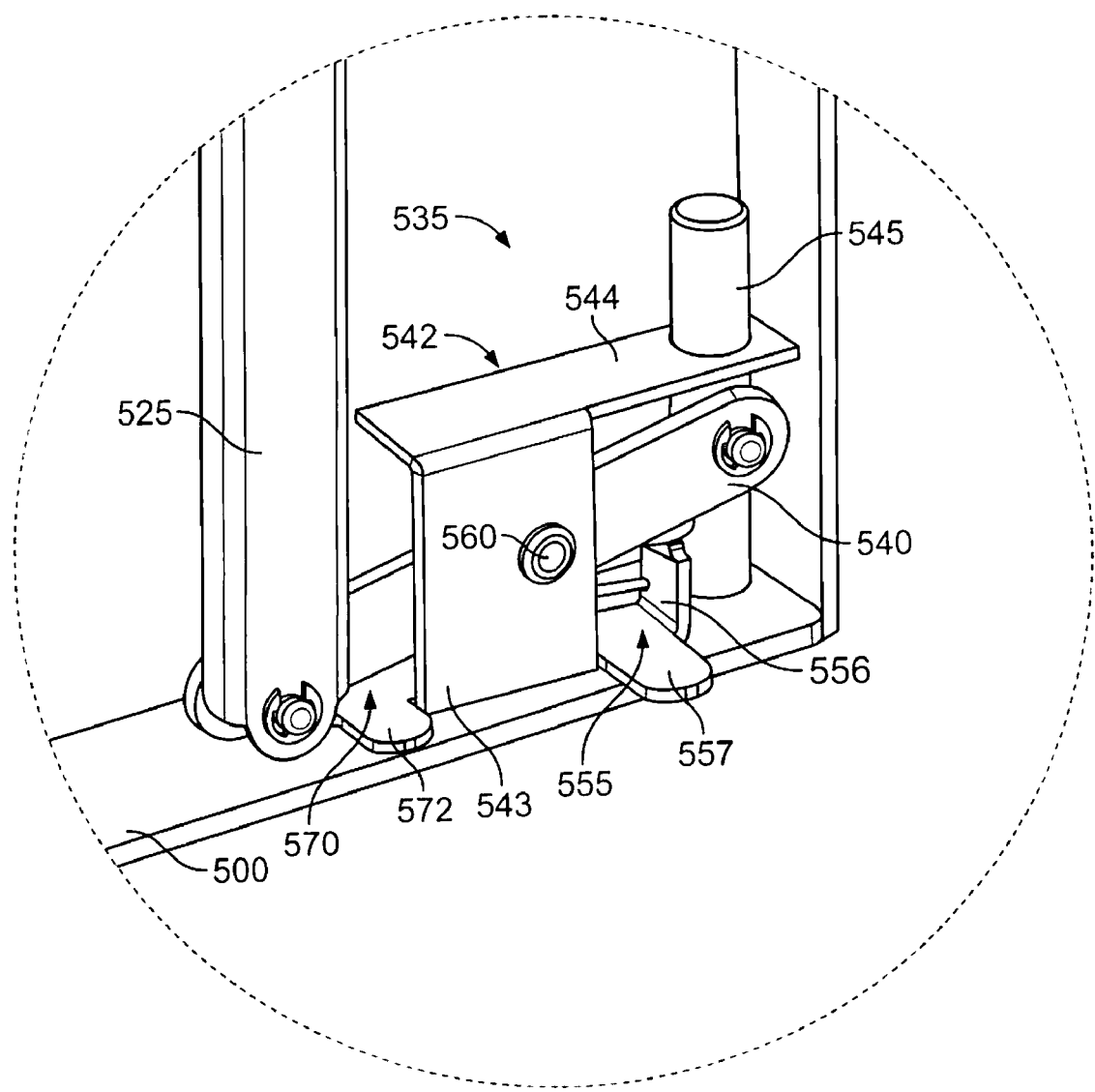
FIG. 12D is an enlarged partial view of a second safety hinge of the front door shown in FIG. 12A.

Referring to FIG. 12A, at each top and bottom corner of the front door 500 (four positions total) is a locking hinge assembly 535. FIGS. 12B and 12D show the locking hinge assemblies 535 on the bottom corners of the front door 500 and it will be understood that the assemblies on the top corners are identical to those described herein for the bottom corners. FIG. 12C shows the backside of the latch mechanism shown in FIG. 12B. Each locking hinge assembly 535 includes a hinge lever 540, hinge support 542, hinge pin 545, an inner lever stop 555, and an outer lever stop 570. As used herein, an inner lever stop 555 is the lever stop that is closest to the hinge pin 545 and an outer lever stop 570 is the lever stop that is furthest from the hinge pin 545.

The hinge support 542 has a generally vertical wall 543 that is attached to the front door 500, such as by welding, with screws, etc., and a generally horizontal wall 544 extends generally perpendicular from the top of the vertical wall 543. The hinge lever 540 is mounted to the vertical wall 543 of hinge support 542 by pin 560 such that lever aim 540 can rotate about pin 560. Hinge lever 540 is also rotatably connected to a lower rod 525 (or upper rod 520 depending on which locking hinge assembly) at one end and to the hinge pin 545 at the end opposite the lower rod 525. The hinge pin 545 extends generally vertically through the front door 500 and through the horizontal wall 544.

A lever stop hinge pin 550, as seen in FIG. 12C, is attached to the front door 500 and the lever stops 555, 570 are mounted onto the lever stop hinge pin 550 such that the lever stops 555, 570 can rotate about the hinge pin 550. Each of the lever stops 555, 570 has a generally vertical stop arm 556, 571 and a generally horizontal release arm 557, 572. A torsion spring 565 is mounted on the lever stop hinge pin 565 and has ends that extend out to the stop arms 556, 571 of the lever stops 555, 570 to bias the lever stops 555, 570 into a forward position.

In operation, when the front door 500 is closed (the closed position is defined as both top corners of the front door 500 seated against the top cover 200 and both bottom corners of the front door 500 seated against the door mount 15) the upper and lower rods 520, 525 are pulled towards the center of the front door 500, thereby rotating the lever arms 540 and extending the hinge pins 545 into their corresponding bushings 600 in the door mount 15 or top cover 200. Therefore, the hinge pins 545 in each of the four corners of the front door 500 engage the bushings 600 in the door mount 15 or top cover 200 and the front door 500 is fully secured. In addition, when in the closed position, the door mount 15 or top cover 200 will push against the release arms 557, 572 of both lever stops 555, 570, thereby disengaging the stop arms 556, 571 of both lever stops 555, 570 from the hinge lever 540. This allows the hinge lever 540 to rotate freely in either direction. Referring specifically to FIG. 12B, when a door handle is rotated from a closed to an open position the lower rod 525 is lowered, the hinge lever 540 is rotated counter-clockwise about pin 560, and the hinge pin 545 is raised. This enables the front door 500 to be hinged open about the hinge pins 545 in the opposite side. Conversely, when the lower rod 525 is raised (e.g., the door handle is moved from an open to a closed position), the hinge lever 540 will rotate clockwise about pin 560 and lower the hinge pin 545.

Referring specifically to FIGS. 12B and 12D, operation of the locking hinge assemblies 535 is shown when the left side of the front door is unlocked and the front door is opened from left to right (as seen when facing the front of the network cabinet 10), as shown in FIG. 12A. FIG. 12B shows the operation of the locking hinge assemblies 535 on the side of the front door 500 that remains engaged, and FIG. 12D shows the operation of the locking hinge assemblies 535 on the side of the front door 500 that is disengaged.

Referring to FIG. 12B, when the front door 500 is moved from the closed position the door mount 15 no longer pushes against the release arms 557, 572 of the lever stops 555, 570 and the torsion spring attempts to push the lever stops 555, 570 into a forward position. Because the hinge lever 540 is still in the locked position, the inner lever stop 555 is blocked by the hinge lever 540 and cannot rotate forward. However, the outer lever stop 570 is not obstructed by the hinge lever 540 and is pushed into a forward position by the torsion spring. When the outer lever stop 570 is in the forward position, the stop arm 571 is positioned underneath the hinge lever 540, thereby preventing the hinge lever 540 from rotating. Therefore in this position, if a user were to attempt to turn the door handle (attempting to move the lower rod 525 downward) the stop arm 571 prevents the hinge lever 540 from moving, thereby preventing the door handle from being moved. This prevents an engaged hinge from being accidentally disengaged if the opposing hinge is disengaged and the front door 500 is open. Should this accidental disengagement not be prevented, front door 500 could easily fall onto and injure a person positioned in front of the network cabinet 10.

Referring to FIG. 12D, to move the front door 500 from the closed position the locking hinge mechanisms 535 on the side to be opened must be disengaged. When a user turns the door handle the lower rod 525 is pushed down, which rotates the hinge lever 540 and pulls back the hinge pin 545. After the locking hinge mechanisms 535 have been disengaged and the front door 500 is moved from the closed position, the door mount 15 no longer pushes against the release arms 557, 572 of the lever stops 555, 570 and the torsion spring attempts to push the lever stops 555, 570 into a forward position. Because the hinge lever 540 has been moved from the locked position, the outer lever stop 570 is blocked by the hinge lever 540 and cannot rotate forward. However, the inner lever stop 555 is not obstructed by the hinge lever 540 and is pushed into a forward position by the torsion spring. When the inner lever stop 555 is in the forward position, the stop arm 556 is positioned underneath the hinge lever 540, thereby preventing the hinge lever 540 from rotating. Therefore, in this position, if a user were to attempt to turn the door handle (attempting to move the lower rod 525 upward) the stop arm 557 prevents the hinge lever 540 from moving, thereby preventing the door handle from being moved. This prevents the closing of the door handle until the front door 500 is in the fully closed position such that lever stop 555 has been pushed backward thereby unobstructing hinge lever 540 allowing hinge pin 545 to be lowered through and fully engage bushing 600.

As can be seen from the above description, the locking hinge assemblies 535 require that the front door 500 be in a closed position before the user can change the state of the front door 500 (e.g., engage or disengage the locking hinge assemblies 535). This accomplishes two important goals: (1) it prevents unexpected and accidental removal of the front door 500 (when one side is open, the other side is locked and cannot be disengaged until the front door 500 is closed): and (2) it prevents a user from mistakenly thinking that the front door 500 is closed when it is still ajar (the door handle cannot be moved into the closed position until the front door 500 is completely closed and the lever stops allow movement of the hinge lever).

To remove the front door 500, the front door 500 is first placed in the closed position. In this position all of the inner and outer lever stops 555, 570 of all of the locking hinge assemblies 535 are pushed into a retracted position allowing all of the hinge levers 540 to move freely. While in the closed position, both of the door handles are turned which will disengage all of the locking hinge assemblies 535 by extending the upper and lower rods 520. 525 and retracting the hinge pins 545 from their respective bushings 260, 600, allowing removal of the front door 500. Once the front door 500 has been removed, the inner lever slops 555 are move into their forward position by the torsion spring 565, thereby obstructing the hinge lever 540 and preventing the door handles from being turned. To install the front door 500, the above process is reversed. The front door 500 is placed against the door mount 15 and top cover 200 such that the hinge pins 545 are aligned with their respective bushings 260, 600. In this position, the door mount 15 and top cover 200 will push the inner lever stops 555 backwards and out of the way of the hinge lever 540, thereby allowing the hinge lever 540 to move freely. Both of the door handles are then turned to retract the upper and lower rods 520, 525 and thereby extend the hinge pins 545 into their respective bushings 260, 600.

Figure 12E:
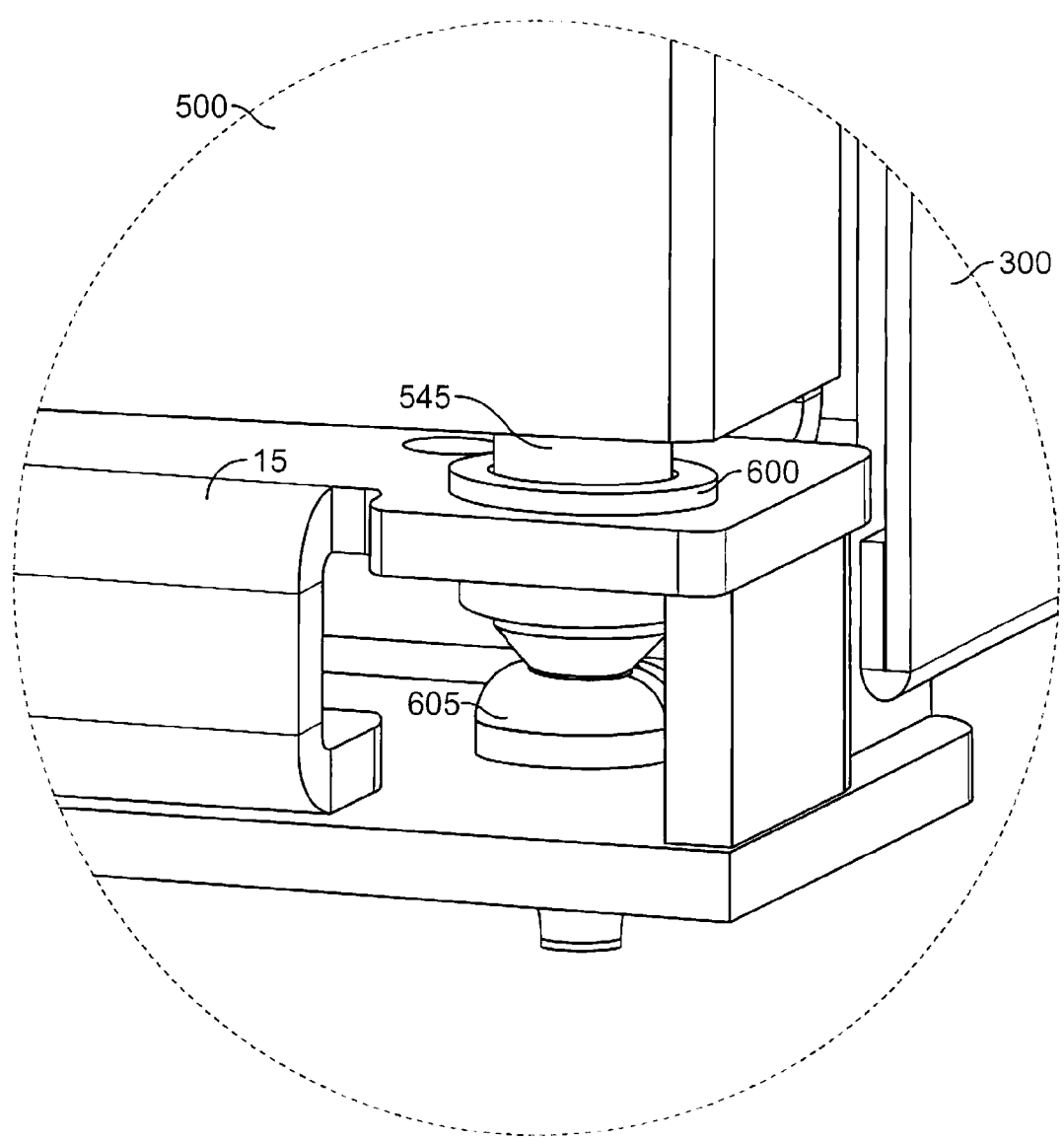
FIG. 12E is an enlarged partial view of a front door lifting mechanism of the front door shown in FIG. 12A.

Referring to FIG. 12E, the engagement between the hinge pin 545 of the front door 500 and the door mount 15 is shown. The hinge pin 545 extends through and engages a bushing 600 that is positioned in a hole in the top of the door mount 15. In this example, lifting screw 605 is threaded into the bottom portion of the door mount 15 just below the bushing 600 that engages the hinge pin 545. As the door handle is moved into the closed position, the hinge pin 545 moves down through the bushing 600 and contacts the lifting screw 605. After the hinge pin 545 contacts the lifting screw 605, the hinge pin 545 continues to move downward and lifts the front door 500 off of the bushing 600. Therefore, the front door 500 rides on the hinge pin 545, which provides clearance between front door 500 and door mount 15 when closing the front door 500 and compensates for door sag and/or worst case tolerance stackups.

Figure 12F:
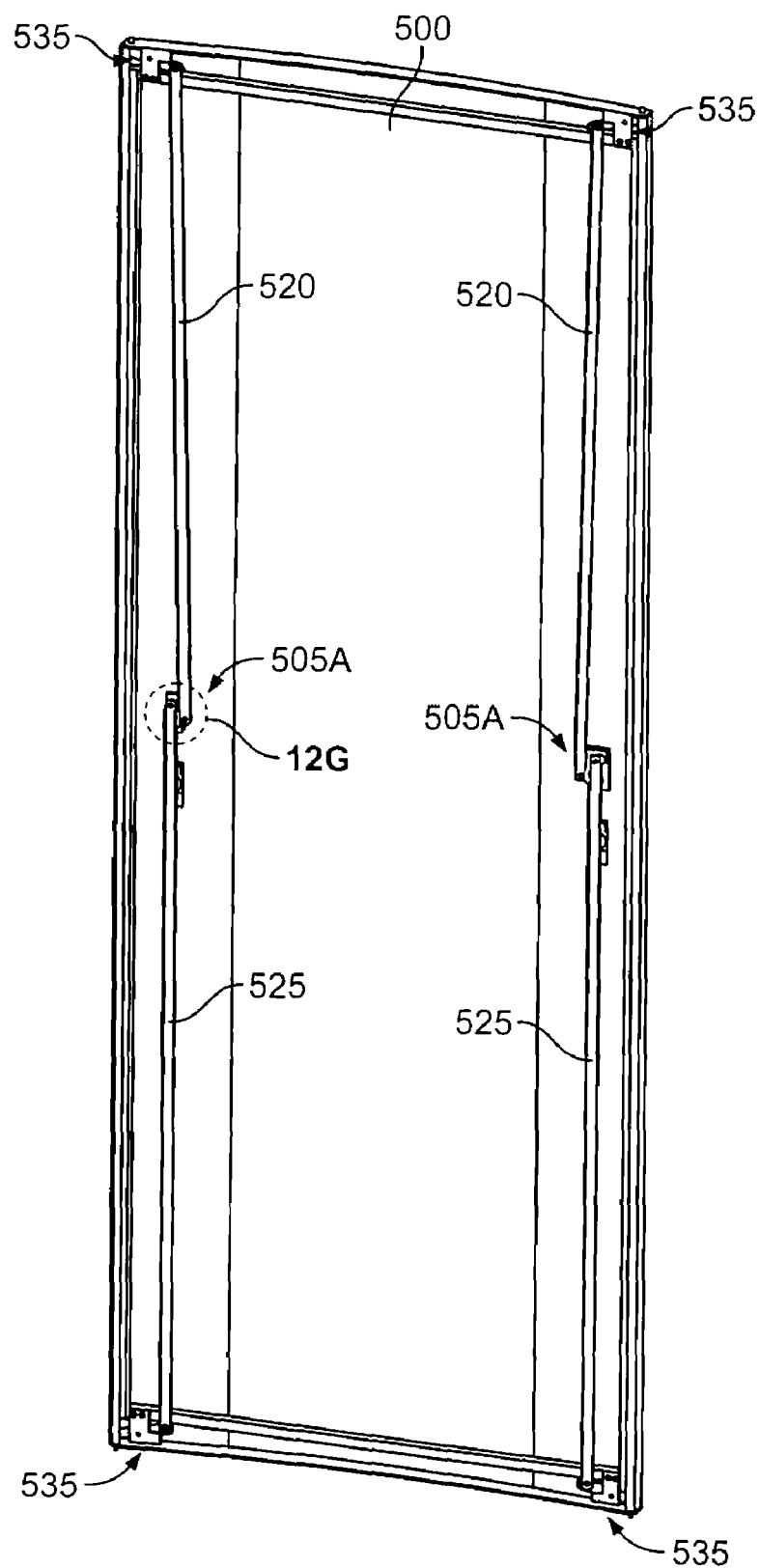
FIG. 12F is a back perspective view of the front door of the network cabinet shown in FIG. 12A with an alternative latch mechanism.
Figure 12G:
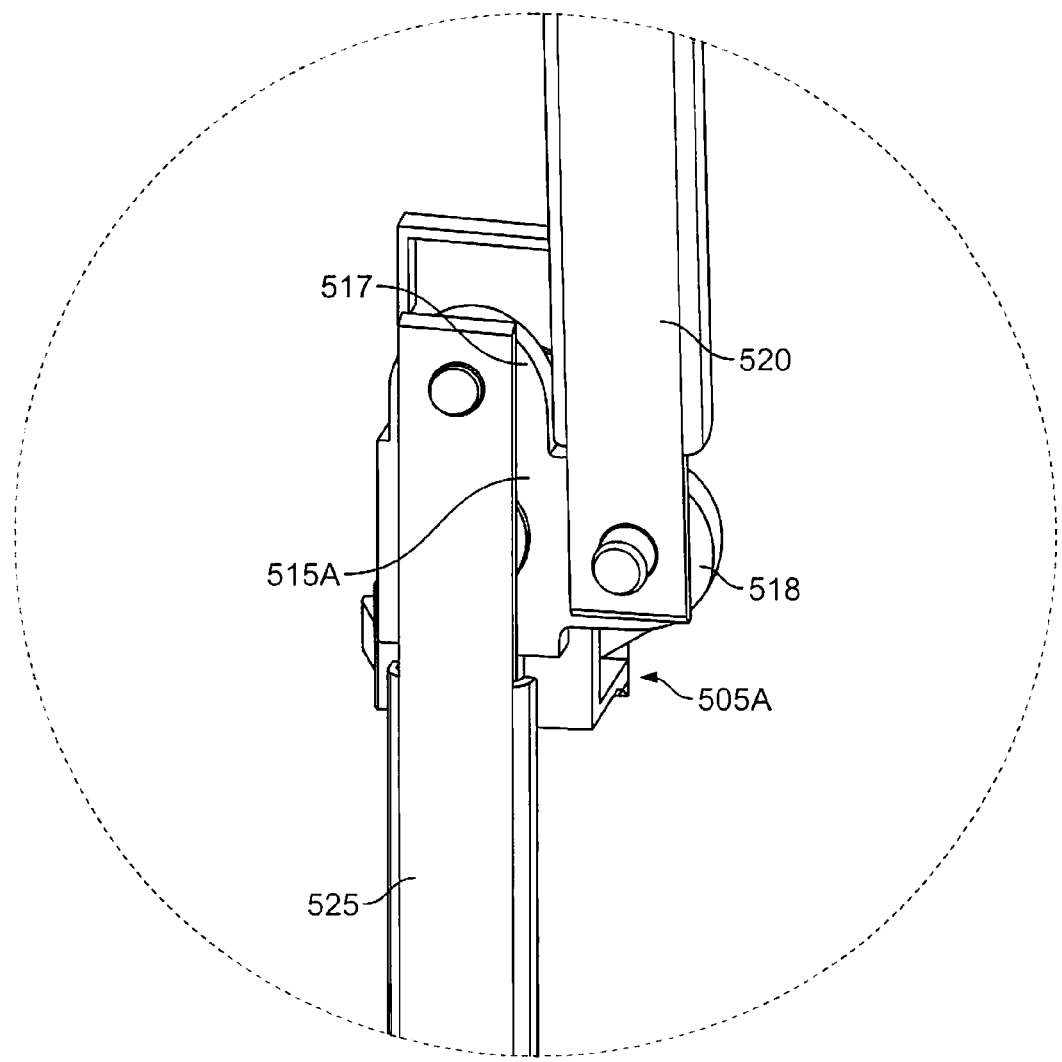
FIG. 12G is an enlarged partial view of the alternative latch mechanism of the front door shown in FIG. 12F.

In the example described above, with the weight of front door 500 riding on hinge pin 545 (rather than on bushing 600), there is a constant force on the bottom hinge pins 545 attempting to push hinge pins 545 into a retracted position. If the door handle is not fully engaged when the front door 500 is in the closed position, the force on the hinge pins 545 could cause the door handle to rotate towards an open position and possibly disengage locking hinge assemblies 535. To prevent this from happening all overcam latch mechanism can be used. Referring to FIGS. 12F and 12G, the overcam latch mechanism 505A is substantially identical to latch mechanisms 505 described above in that it has a door handle (not shown), a cam plate 515A connected to the door handle, and upper and lower rods 520, 525 that are connected to lobes of the cam plate 515A. The main difference between latch mechanism 505 and latch mechanism 505A is the design of the cam plate 515A. The cam plate 515 in latch mechanism 505 has lobes that are aligned and extend outward from the axis of rotation of the cam plate 515. Conversely, the cam plate 515A in the overcam latch mechanism 505A has lobes 517, 518 that are generally perpendicular to each other and extend outward from the axis of rotation of the cam plate 515A.

As can best be seen in FIG. 12G, when the front door 500 is in the closed position and the locking hinge assemblies 535 are engaged, the lobe 517 that is connected to lower rod 525 (and therefore bottom hinge pin 545) is extending substantially vertically. In operation, a force exerted on the lower hinge pin 545 that attempts to retract the hinge pin 545 (such as the weight of the front door 500 riding on hinge pin 545) will place a downward force on the lower rod 525. However, since lobe 517 is oriented vertically, this downward force on lower rod 525 will not cause the cam plate 515A (and therefore the door handle) to rotate. In order to rotate the door handle and cam plate 515A, a positive rotational force must be placed on the door handle to move the lobe 517 from a vertical position. This design prevents the door cam plate 515A and door handle from rotating due to the force exerted by the weight of front door 500 on lower hinge pin 545.

Figure 13:
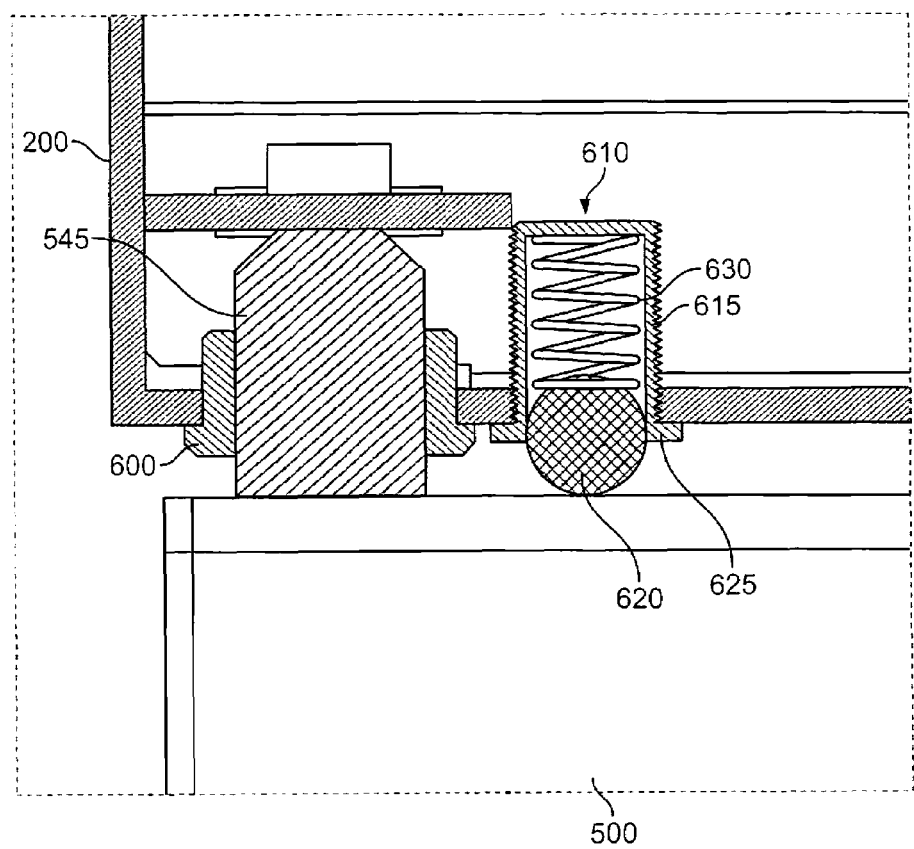
FIG. 13 is a cross-sectional view taken along line 13-13 in FIG. 12A.

Referring to FIG. 13, in this embodiment the front door 500 is also bonded to the top cover 200 by spring loaded bearing assemblies 610. Two spring loaded bearing assemblies 610 are positioned one at opposite corners of the top cover 200, one near each bushing 600 and hinge pin 545. In positioning spring loaded bearing assembly 610 near hinge pin 545, bearing assembly 610 maintains contact with front door 500 as front door 500 is swung to an open position. By using two bearing assemblies 610, the front door 500 stays bonded to the top cover 200 when closed, open to the left, or open to the right. Each spring loaded bearing assembly 610 has a generally cylindrical body 615, a ball bearing 620, a face plate 625, and a spring 630. Body 615 is steel or another conductive material and has external threads that permit body 615 to be screwed into paint masked compatible threads in the top cover 200 until the steel face plate 625 is flush with the top cover 200, which provides a bond between the spring loaded bearing assembly 610 and the top cover 200. Ball bearing 620 is steel or other conductive material and is biased towards face plate 625 by conductive spring 630 and protrudes beyond face plate 625 so that it contacts the top of the front door 500. The top of the front door 500 is masked where the ball bearing 620 will contact the front door 500, which provides a bond between the bearing assembly 610 and the front door 500. The bearing assemblies are positioned close enough to the bushing 600 and hinge pin 545 so that the front door 500 can open to approximately 160 degrees while maintaining the bond between the front door 500 and the top cover 200. The use of the bearing assemblies 610 to create the bond between the front door 500 and the top cover 200 allows for the removal of the front door 500 without the need to disconnect any jumper wires.

Alternatively, as can be seen in FIGS. 12B and 12E, rather than bonding the front door 500 to the base frame 100 through a spring loaded bearing assembly 610 in the top cover 200, the front door 500 can be bonded to the base frame 100 through the lifting screw 605 in the door mount 15. To bond the front door 500 in this manner, the lifting screw 605 is first bonded to the door mount 15. This can be done by using a trilobular lifting screw, by placing an internal tooth lock washer between the head of the lifting screw and the door mount, by using a lifting screw that has teeth on the underside of the head, or by paint masking a the portion of the door mount that will contact the head of the lifting screw. The hinge pin 545 is then bonded to the front door 500, such as by attaching a jumper wire between the hinge pins 545 and the front door 500. Therefore, when the hinge pins 545 contact the lifting screws 605, a bond is created between the front door 500 and the door mount 15 through the jumper wire, hinge pins 545, and lifting screws 605.

As can be seen from the detailed descriptions above, in this embodiment when the network cabinet 10 is fully assembled, all of the components of the cabinet are bonded together. The components that make up the base flame 100 are all bonded by welding them together. The door mounts 15, equipment rails 20, and top cover 200 are bonded to the base frame by use of internal tooth lock washers. The side panels 300 are bonded to the top cover 200 by use of grounding clips 335. The back doors 400 are grounded to the top cover 200 by spring loaded grounding hinge mechanisms 435. Finally, the front door 500 is grounded to the top cover 200 by the spring loaded bearing assemblies 610. By bonding all of the components of the cabinet together, separate grounding jumper wires are not required and the network cabinet 10 is completely grounded and requires only a single point of contact with the main building ground (e.g., the ground whip 25).

Figure 14A:
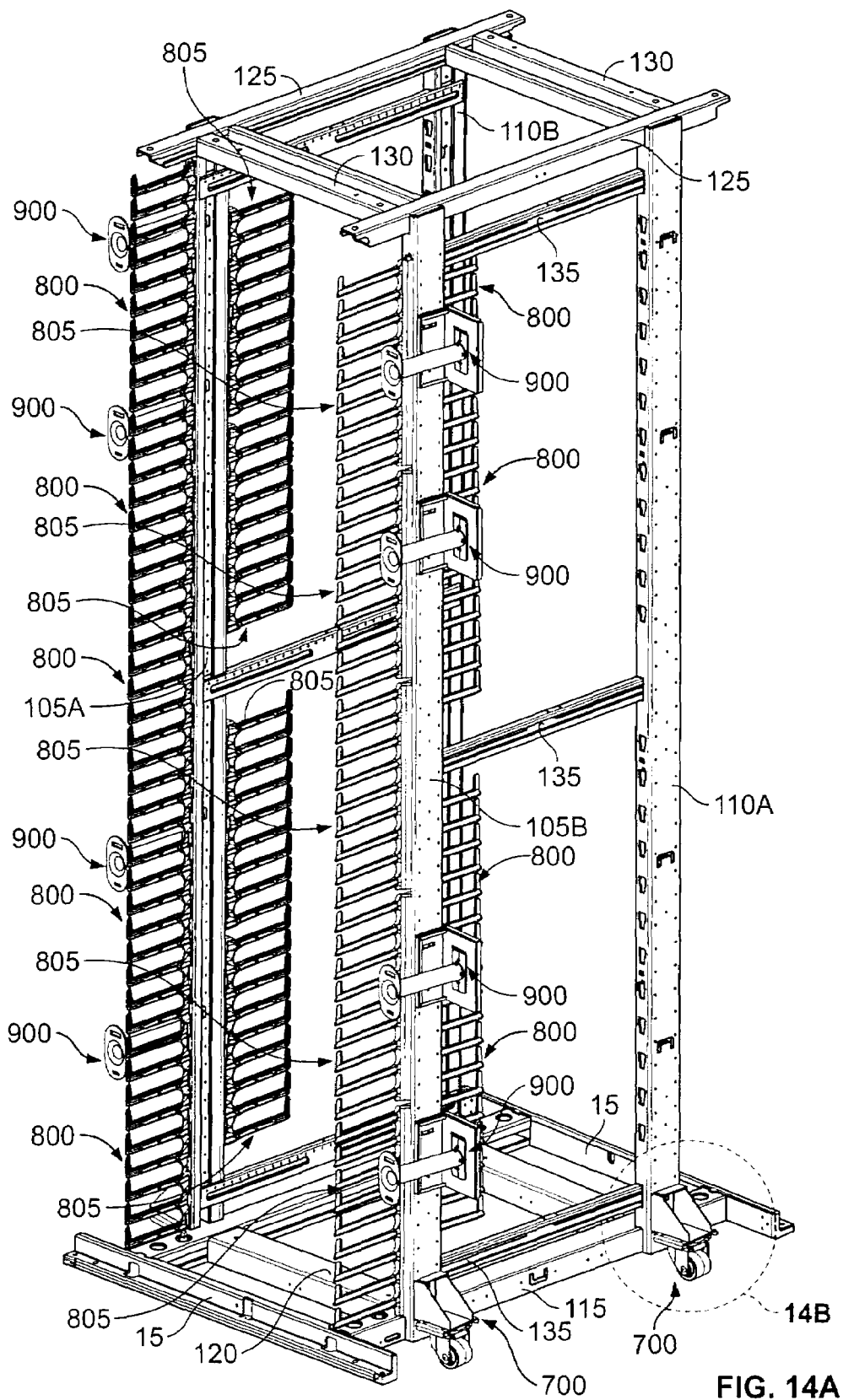
FIG. 14A is a front perspective view of the base frame of the network cabinet of the current invention with caster assemblies, cable management units, and slack management spools attached.

Referring to FIG. 14A, the network cabinet 10 can also include caster assemblies 700, cable management fingers 800, and slack management spools 900.

Figure 14B:
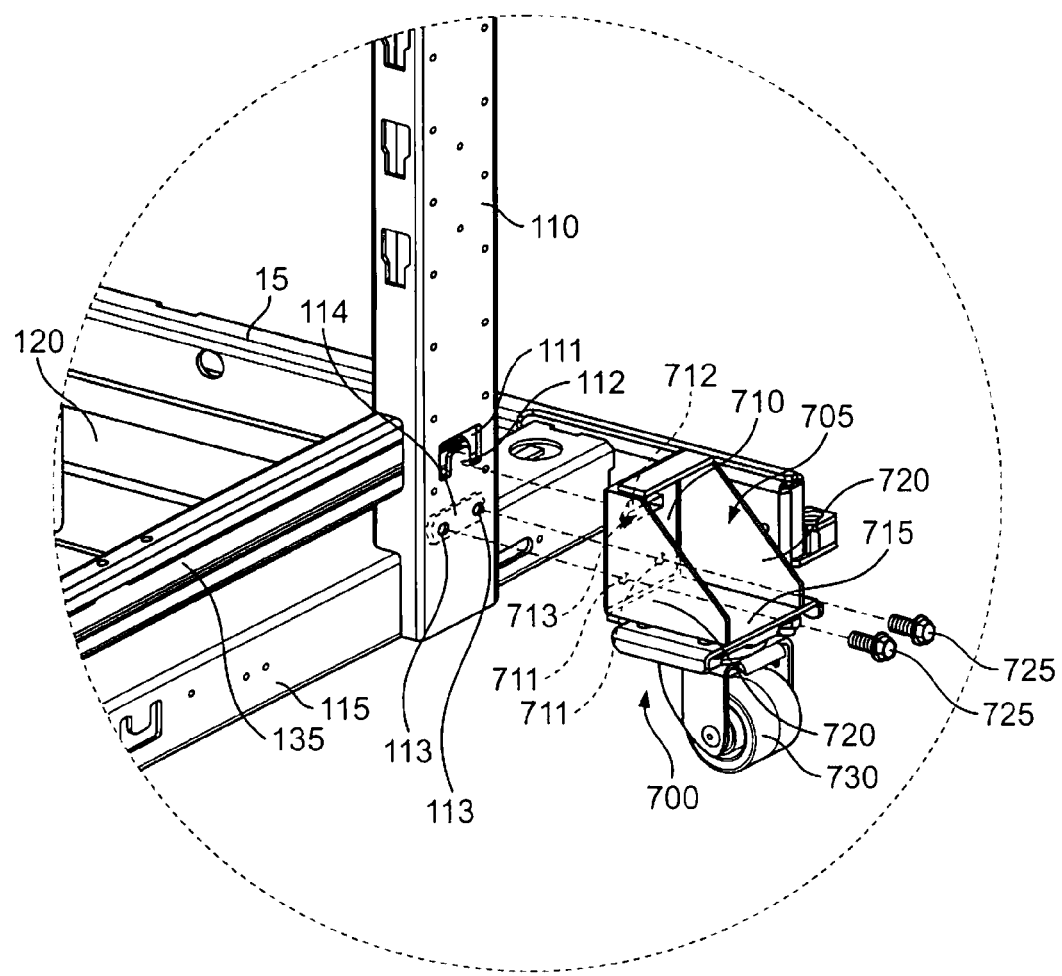
FIG. 14B is an exploded, enlarged partial view of a caster assembly shown in FIG. 14A.

Referring to FIGS. 14A and 14B, in this example caster assemblies 700 are mounted to the sides of front and back vertical frame rails 105, 110, alleviating the need to tip or turn the network cabinet 10 or base frame 100 in order to install, remove, or repair the caster assemblies 700. Caster assemblies 700 include a body 705, which is steel or other conductive material and is formed by a first wall 710, a second wall 715 that extends generally perpendicular to the first wall 710, and a pair of support walls 720 that extend between the first wall 710 and second wall 715 to provide strength and rigidity to the body 705.

A standard caster wheel 730 is attached to the second wall 715 of the body 705. The first wall 710 of the body 705 has a pair of holes 711 and a wall member 712 that extends from the first wall 710 to form a slot 713 between the wall member 712 and the first wall 710.

As shown in FIG. 14B, to install caster assembly 700, the base frame 100 is raised by rotating the leveling legs 60. The first wall 710 of the caster assembly 700 is placed against the back vertical frame rail 110 such that the wall member 712 extends into an aperture 111 in the vertical frame rail 110. The caster assembly 700 is then lowered such that a tongue 112 formed in the aperture 111 engages the slot 713 formed between the wall member 712 and the first wall 710 and holes 711 in the first wall 710 are aligned with holes 113 that are formed in the back vertical frame rail 110. A pair of bolts 725 are inserted through the holes 711 in the first wall 710 and the holes 113 in the back vertical frame rail 110 and are threaded into a jam-nut 114 that is welded to the back vertical frame rail 110. The base frame 100 is then lowered by rotating the leveling legs 60 until the base frame rests on the caster assemblies 700. In addition to attaching the caster assembly 700 to the back vertical frame rail 110, the bolts 725 and jam-nut 114 can also provide bonding between the caster assembly 700 and the back vertical frame rail 110. To create the bond, the bolts 725 can have serrations or teeth on the underside of the head that bite through any paint into the metal of the body 705 to provide a bond between the body 705 and the bolts 725. Alternatively, standard bolts could also be used with internal tooth lock washers to provide the bond or standard bolts could be used and the area around the holes 711 could be paint masked to provide the bond if bonding is desired.

Figure 15A:
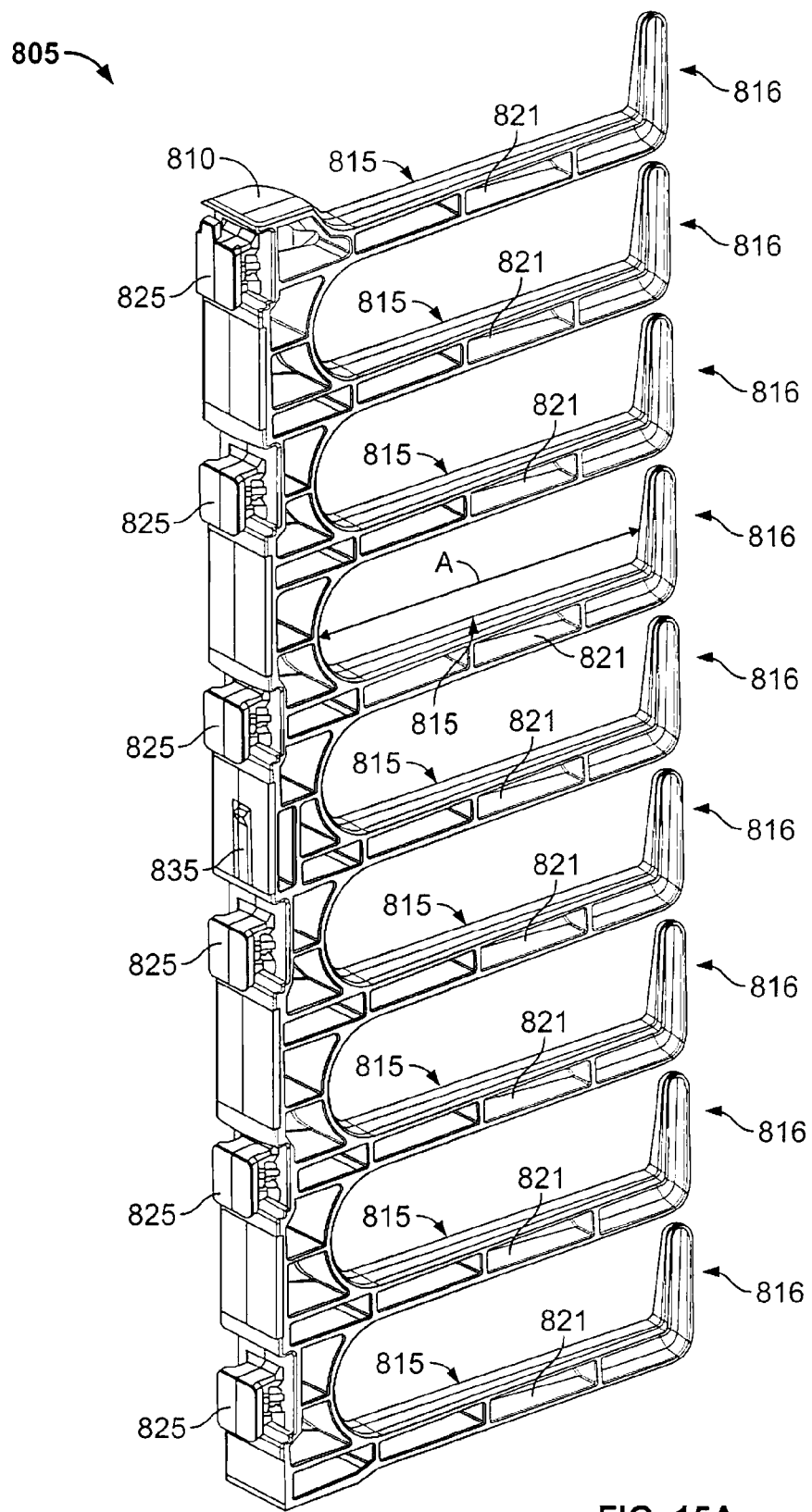
FIG. 15A is a back perspective view of a right hand cable management unit.
Figure 15B:
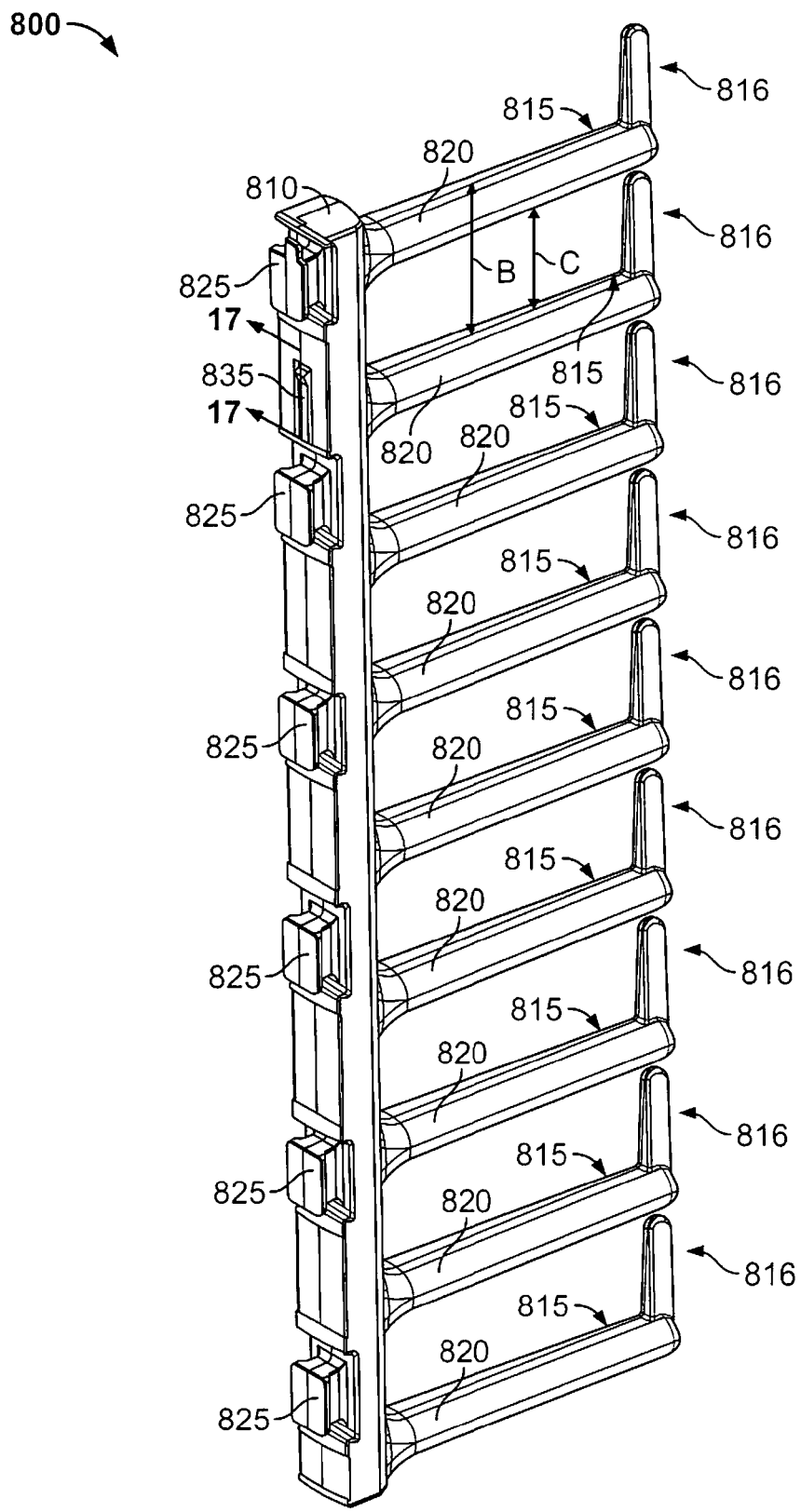
FIG. 15B is a back perspective view of a left hand cable management unit.

Referring to FIGS. 14A, 15A, and 15B, in this example multiple left hand cable management units 800 and right hand cable management units 805, which are mirror images of each other, can be mounted to the front and back faces of front vertical frame rails 105A, 105B and front and back faces of the back vertical frame rails 110A, 110B. As used herein, the front faces of front and back vertical frames rails 105A, 105B, 110A, and 110B are the faces that face outward from base frame 100 and are directly accessible from the outside of base frame 100. The back faces of front and back vertical frame rails 105A, 105B, 110A, and 110B are the faces that are opposite the front faces, face inward towards the inside of base frame 100, and are generally accessible from the inside or sides of base frame 100. For convenience. FIG. 14A shows left and right hand cable management units 800, 805 mounted only to the front and back faces of front vertical frame rails 105A and 105B.

As described in more detail below, left hand cable management units 800 would be mounted to the front faces of left side front vertical frame rail 105A (left side when facing the cabinet from the front) and left side back vertical frame rail 110A (left side when facing the cabinet from the back) and to the back faces of right side front vertical frame rail 105B and right side back vertical frame rail 110B. Right hand cable management units 805 would be mounted to the front faces of right side front vertical frame rail 105B and right side back vertical frame rail 110B and to the back faces of left side front vertical frame rail 105A and left side back vertical frame rail 110A. In this example, five cable management units 800, 805 can be mounted on the front faces of front and back vertical frame rails 105A, 105B, 110A, and 110B and four cable management units 800, 805 can be mounted in the back faces of front and back vertical frame rails 105A, 105B, 110A, and 110B.

As can best be seen in FIGS. 15A and 15B, in this example each cable management unit 800, 805 is molded plastic and includes a base 810 and nine fingers 815 that protrude and extend from base 810. Each finger 815 has a generally vertically oriented cable retainer 816 at its distal end (opposite the base 810) that prevents cables from spilling out of fingers 815 and provides approximately 6.2 inches of cable management length (shown as A in FIG. 15A) between base 810 and cable retainers 816. Each finger 815 has a semi-circular cross-section in which the outside surface 820 (the surface that faces outside base frame 100 when installed and will contact cables) is solid and has a bend radius of approximately 0.25 inches and inside surface 821 (the surface that faces inside base frame 100 when installed) is cored out to make fingers 815 generally hollow. The bend radius of outside surface 820 provides for the management of cable without any sharp corners which can damage the cables. Conversely, inside surface 821 does not generally contact the cables and therefore can be designed without bend radii and can be cored out for manufacturability purposes.

In the example shown, the spacing between the tops of adjacent fingers 815 is approximately 1.75 inches (shown as B in FIG. 15B), which is equivalent to one rack unit ("RU"). Each finger 815 has a height of approximately 0.5 inches, which provides approximately 1.25 inches of cable management height (shown as C in FIG. 15B). The finger height and spacing combine to allow for management of 48 Cat 6 cables, 24 cat6A cables, or other types of cabling, such as communication cabling, in each RU. The area where base 810 meets each finger 815 also has a bend radius of approximately 0.3 inches.

Figure 16A:
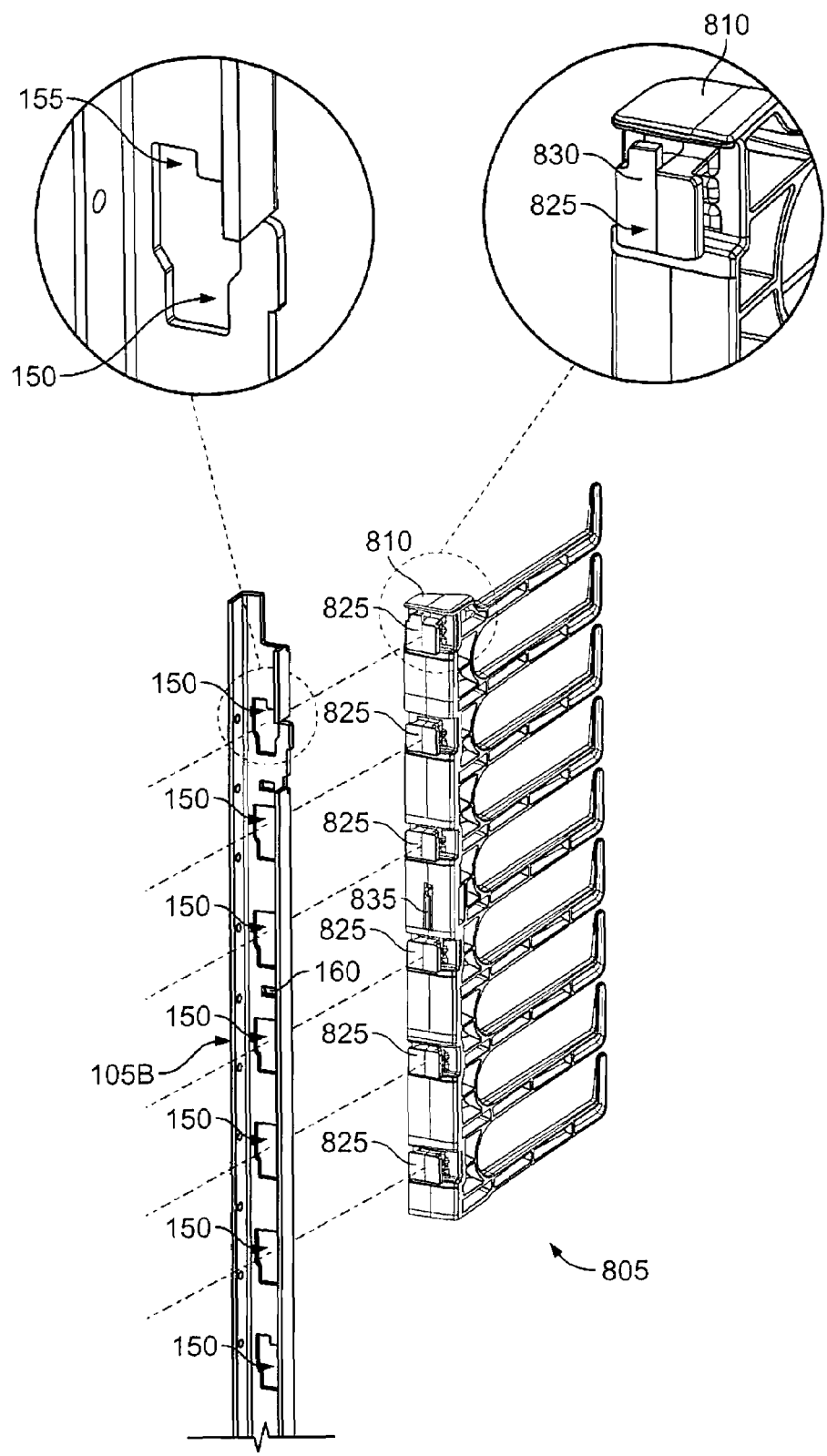
FIG. 16A is an exploded partial enlarged view showing the attachment of a right hand cable management unit to the base frame of the network cabinet of the present invention.
Figure 16B:
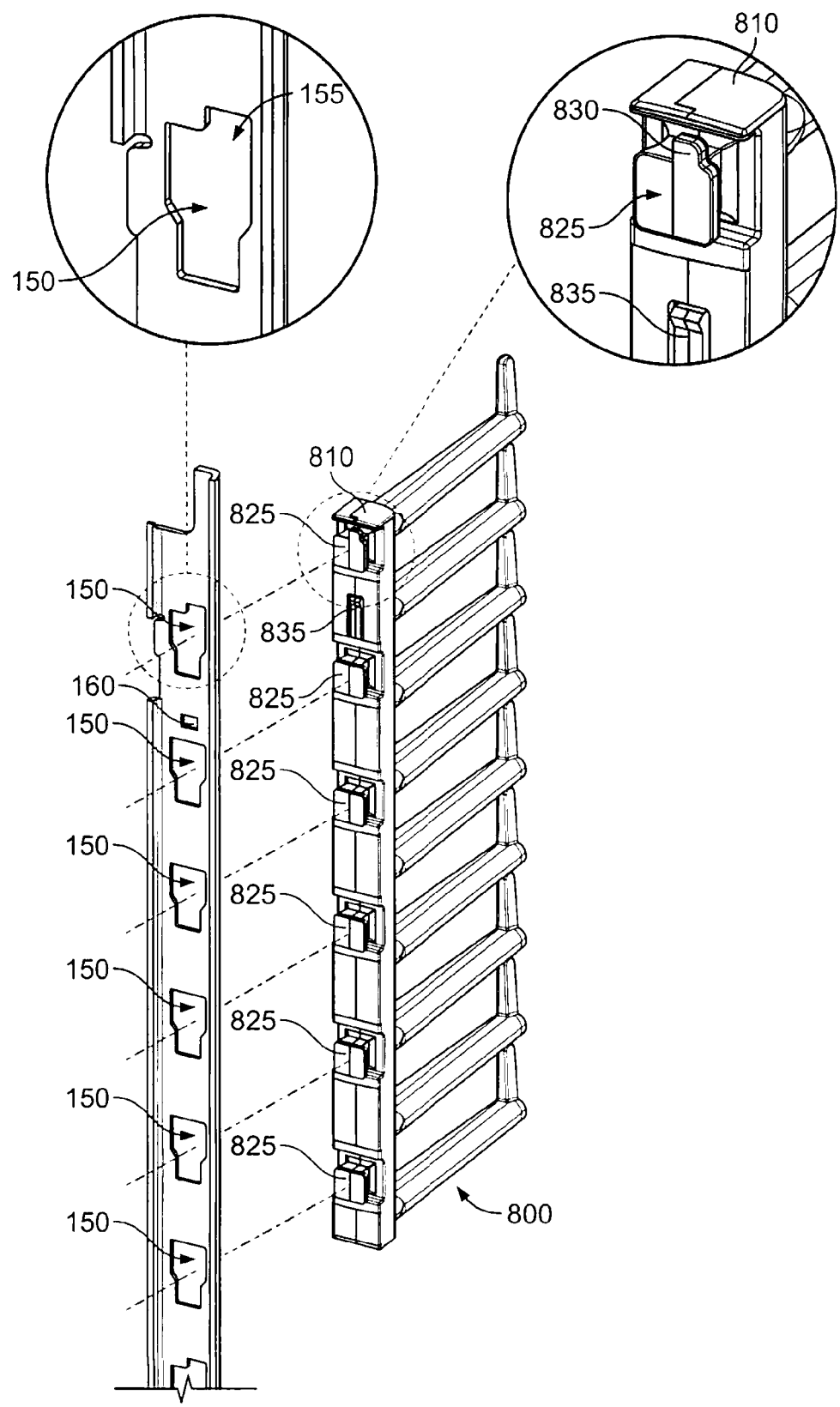
FIG. 16B is an exploded partial enlarged view showing the attachment of a left hand cable management unit to the base frame of the network cabinet of the present invention.

Referring additionally to FIGS. 16A and 16B, in this example each cable management unit 800, 805 includes buttons 825 that protrude from the back surface of base 810, opposite the fingers 815. Buttons 825 are adapted to engage corresponding apertures 150 in the faces of front and back vertical frame rails 105, 110 to mount cable management units 800, 805 to vertical frame rails 105, 110. Buttons 825 are inserted into corresponding apertures 150 and the cable management unit 800, 805 is pushed down to snap it into place. This allows the manual assembly and removal of cable management units 800, 805 with no additional fasteners or tools. In addition, when multiple cable management units are mounted, a gap of approximately 0.75 inches is left between adjacent units to allow for removal of individual units without having to remove units mounted above.

As can best be seen in the enlarged partial views in FIGS. 16A and 16B, on each cable management unit 800, 805, one of the buttons 825 will also include a protrusion 830 that extends laterally from one side of the button. In the example shown, protrusion 830 extends from the top of the button and is skewed to the left for left hand cable management units 800 and skewed to the right for right hand cable management units 805. This protrusion 830 is adapted to coincide with a slot 155 that extends from one side of an aperture 150. One button on each cable management unit 800, 805 will have a protrusion 830 and only selected apertures 150 in vertical frame rails 105, 110 will have slots 155, which act as a keying feature to prevent cable management units 800, 805 from being mounted on the wrong side of a vertical frame rail 105, 110 or from being mounted upside down. Having slots 155 only in predetermined apertures 150 also requires that cable management units 800, 805 be mounted in predetermined positions. Alternatively, all of the buttons 825 could have protrusions 830 and all apertures 150 could have slots 155. This would allow the vertical positioning of the cable management units 800, 805 anywhere along a vertical frame rail while still preventing the mounting on the wrong side of a vertical frame rail or mounting upside down.

Figure 17:
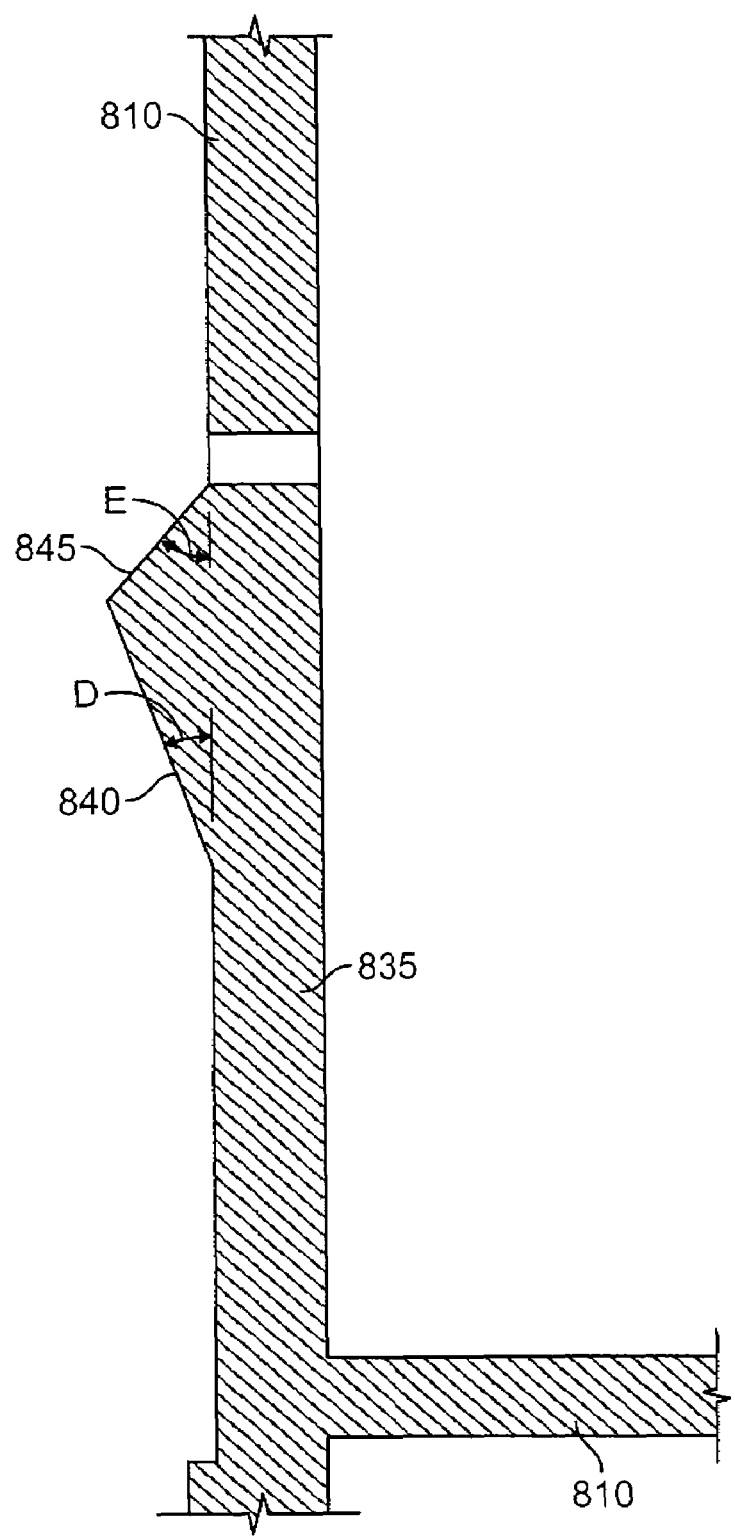
FIG. 17 is a cross-sectional view taken along line 17-17 in FIG. 15B.

As can best be seen in FIGS. 15A, 15B, and 17, each cable management unit 800, 805 can also have a cantilevered locking finger 835 formed in the back surface of base 810. The outside surface of locking finger 835 has a shallow inclined lead in face 840, which is angled from the back surface approximately 20-40 degrees (lead in angle shown as D in FIG. 17), and a steep inclined lead out face 845, which is angled from the back surface approximately 30-50 degrees (lead out angle shown as E in FIG. 17). Locking finger 835 and faces 840, 845 are adapted to engage and snap into a locking slot 160 in vertical frame rails 105, 110 (see FIGS. 16A and 16B) to secure cable management units 800, 805 to vertical frame rails 105, 110. The shallow lead in angle D allows for easy mounting of the cable management units 800, 805, while the steep lead out angle E provides more resistance so that cable management units 800, 805 can be, but are not easily, removed.

Figure 18A:
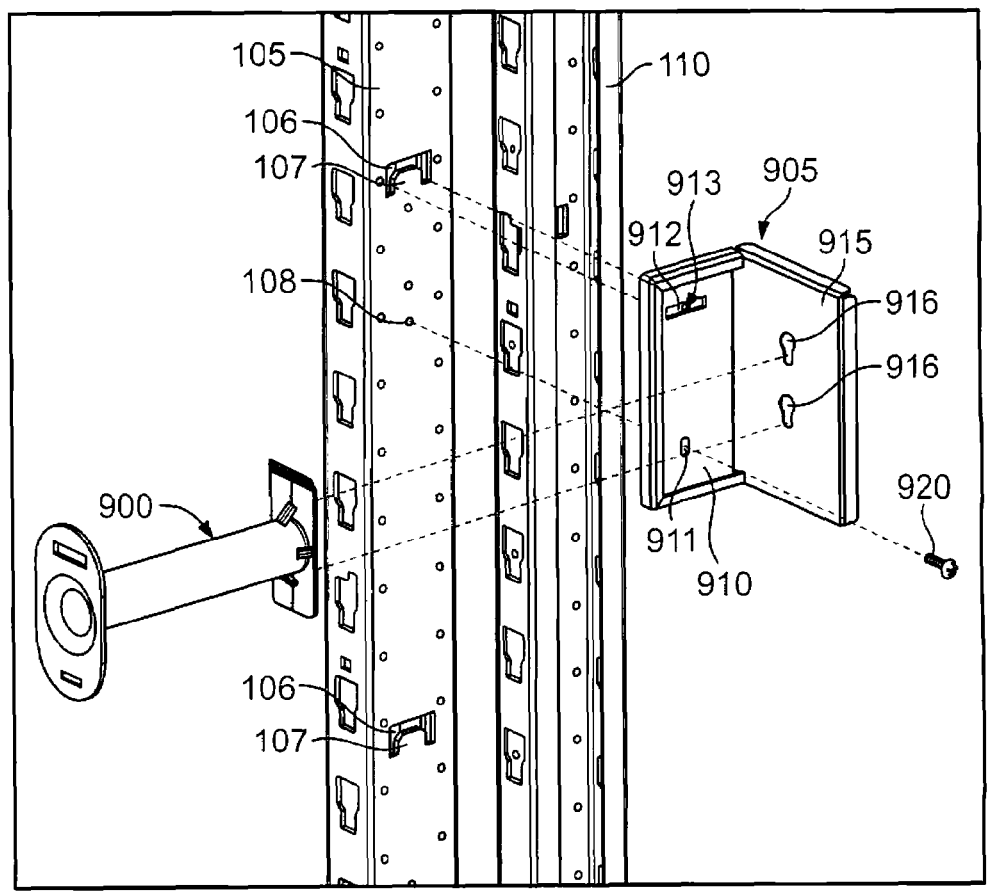
FIG. 18A is an exploded partial enlarged view showing the attachment of a slack management spool to the base frame of the network cabinet of the present invention.
Figure 18B:
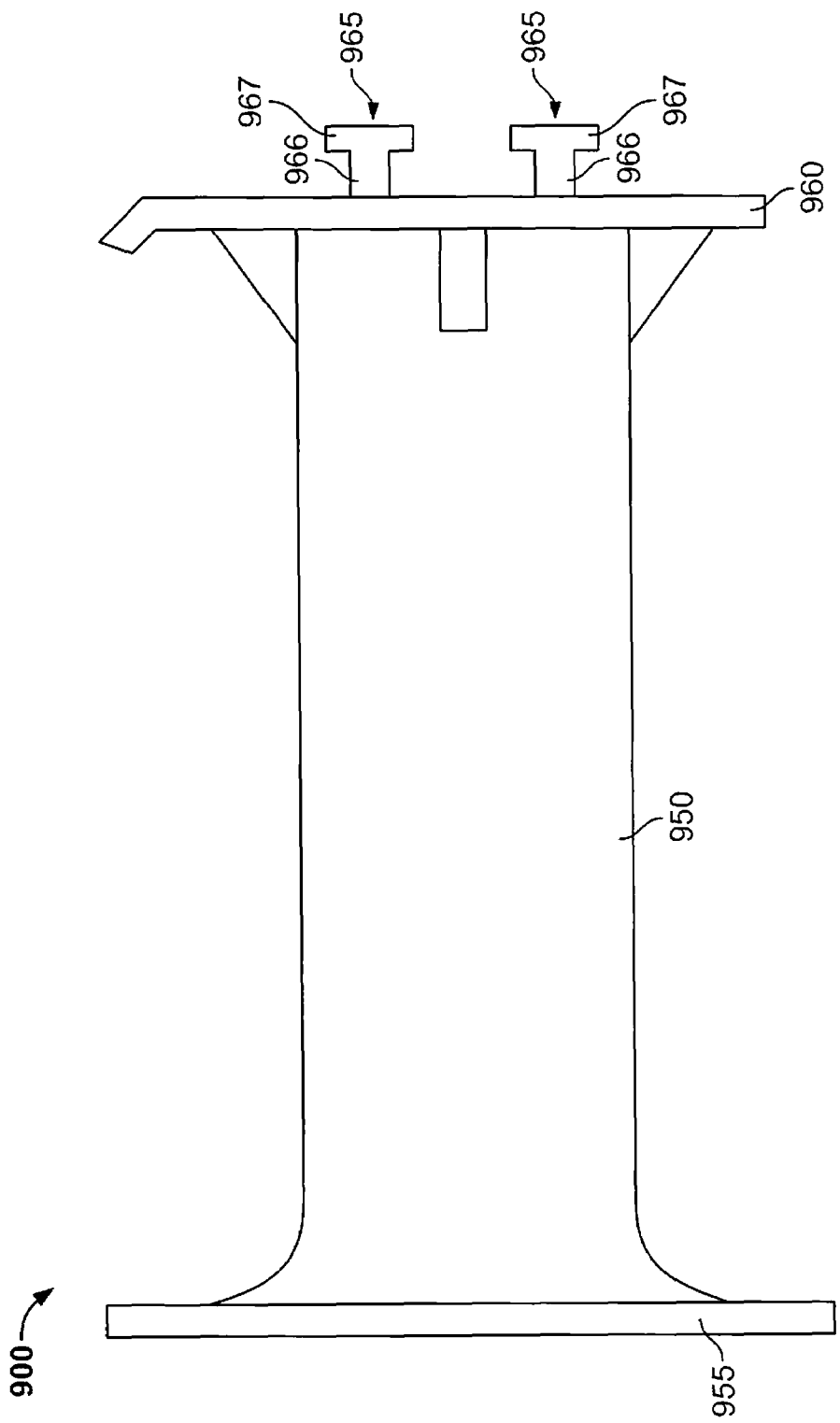
FIG. 18B is a side view of the slack management spool shown in FIG. 18A.

Referring to FIGS. 14A, 18A, and 18B, slack management spools 900 can also be mounted to front and back vertical frame rails 105, 110 via brackets 905.

Referring specifically to FIG. 18B, a slack management spool 900 is shown that, in this example, is plastic and includes a generally cylindrical spool body 950, a stop wall 955 formed at one end of the spool body 950, and a mounting wall 960 formed at the second end of the spool body 950 opposite the stop wall 955. The mounting wall 960 has a pair of generally cylindrical protrusions 965 that are adapted to engage mounting holes in the brackets 905, as seen in FIG. 18A and as discussed in more detail below. Each of the protrusions 965 has a first section 966 that extends from the surface of the mounting wall 960 and has a first dimension and a second section 967 at the end of the first section 966 that has a second dimension, which is greater than the first dimension. In this example, first section 966 and second section 967 are generally circular in design, wherein the first and second dimensions are diameters.

Referring specifically to FIG. 18A, the mounting of a slack management spool 900 to a front vertical frame rail 105 by a bracket 905 is shown. Bracket 905, in this example, is steel and is generally "L" shaped having a first wall 910 and a second wall 915 that extends generally perpendicular to the first wall 910. Alternatively, bracket 905 could be made in any geometry and of any material appropriate for a given application. First wall 910 has a hole 911 and a wall member 912 that extends from first wall 910 to form a slot 913 between wall member 912 and first wall 910. Second wall 915 has a pair of mounting holes 916 that are adapted to receive and secure the protrusions extending from mounting wall 960 of slack management spools 900.

To mount a bracket 905 to a front vertical frame rail 105, first wall 910 of bracket 905 is placed against the front vertical frame rail 105 such that wall member 912 extends into an aperture 106 in front vertical frame rail 105. Apertures 106 are positioned spaced apart along vertical frame rails 105, 110. In this example four apertures 106 are provided in each vertical frame rail 105, 110, as can be seen in FIG. 14A. Bracket 905 is then lowered such that a tongue 107 formed in aperture 106 engages slot 913 formed between wall member 912 and first wall 910. Bracket 905 is lowered until hole 911 in first wall 910 is aligned with a hole 108 formed in the front vertical frame rail 105. A trilobular screw 920 can be inserted through hole 911 in first wall 910 and is threaded into hole 108 in front vertical frame rail 105. Trilobular screw 920 provides a bond to the front vertical frame rail 105 by cutting threads into the metal of front vertical frame rail 105. To provide a bond between trilobular screw 920 and bracket 905, trilobular screw 920 has serrations or teeth on the underside of the head that bite into the metal of bracket 905. Alternatively, a standard bolt could be used with an internal tooth lock washer or a standard bolt could be used and the area around hole 911 could be paint masked and the area within hole 108 could be paint masked as well if bonding is desired.

Slack management spool 900 is then mounted to bracket 905 by inserting protrusions 965 extending from mounting wall 960 through mounting holes 916 in bracket 905 and sliding spool 900 downward until the first section 966 of protrusions 965 engage mounting holes 916.

Figure 20:
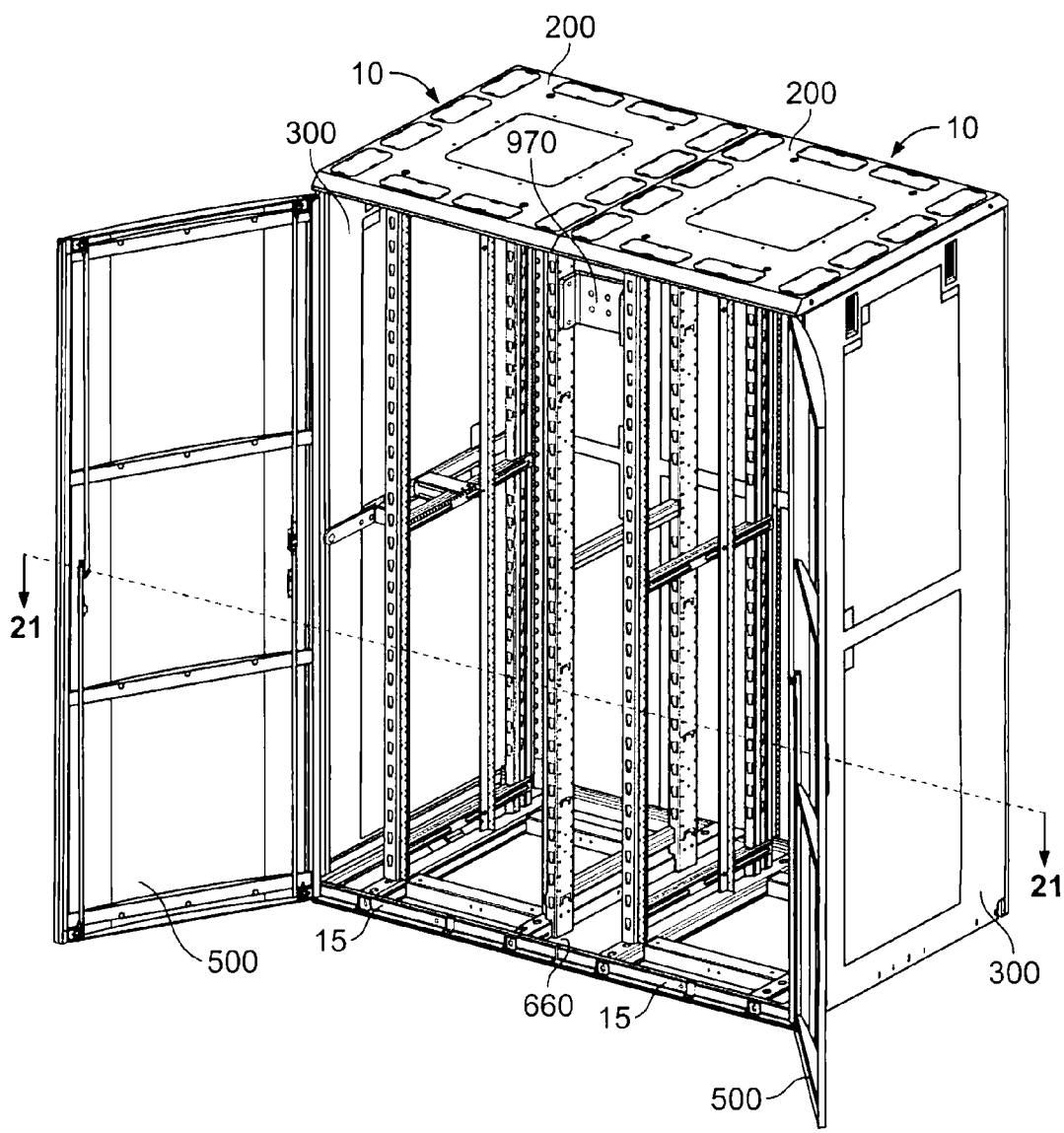
FIG. 20 is a front perspective view of the network cabinets in FIG. 19, with the front doors open.
Figure 21:
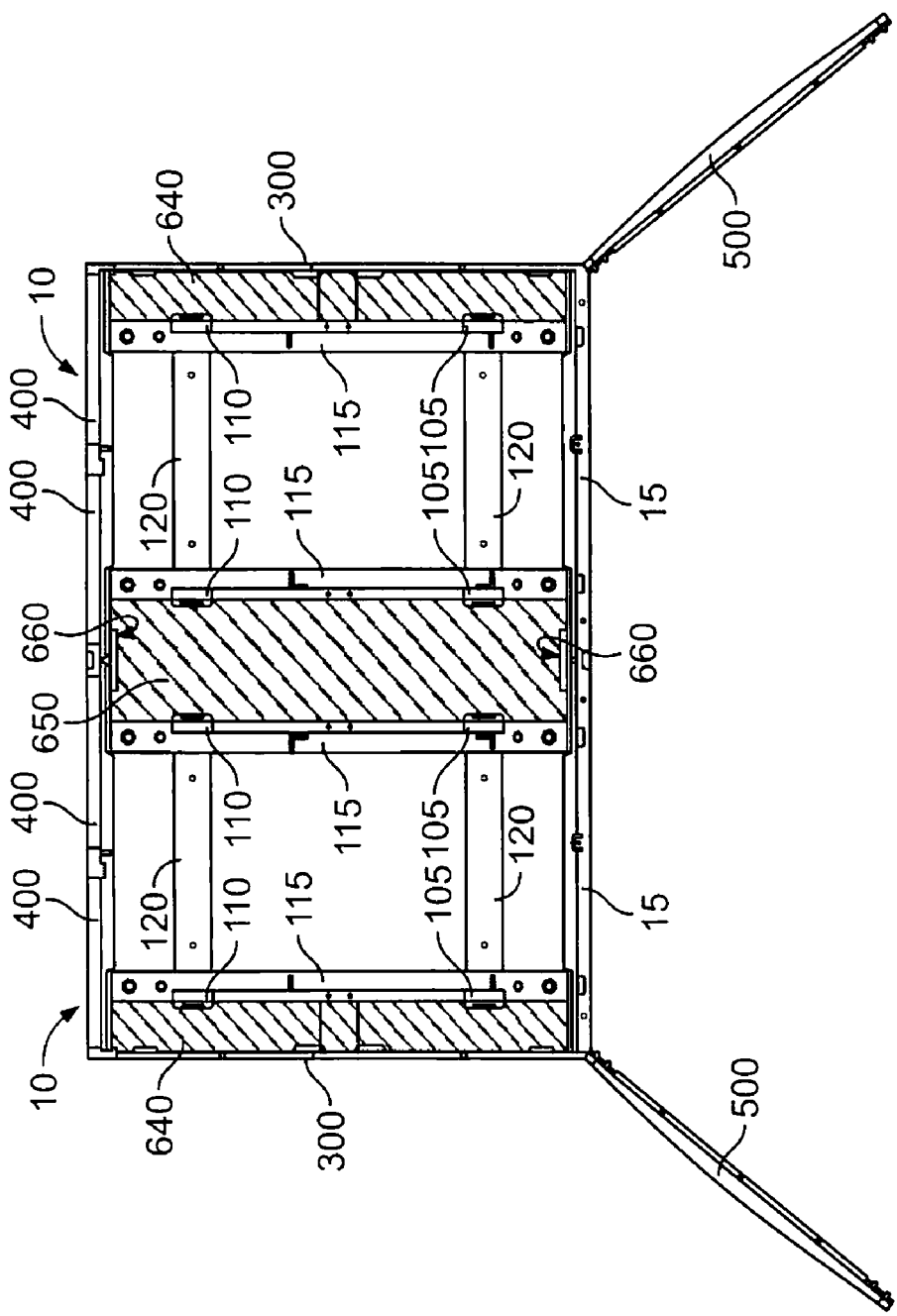
FIG. 21 is a cross-sectional view taken along line 21-21 in FIG. 20.

Referring to FIGS. 19-21, there is shown two network cabinets 10 that are ganged, or joined, together. To gang two network cabinets 10 together the left side panel 300 of the right cabinet is removed and the right side panel 300 is removed from the left cabinet. The cabinets are then positioned next to each other such that the sides with side panels 300 removed are positioned adjacent one another. Top covers 200 of the adjacent network cabinets 10 are secured together by inserting bolts through holes in the adjacent side flanges 202 (not shown in FIGS. 19-21) of top covers 200 and threading nuts onto the bolts to secure the top covers 200 together. Generally "L" shaped steel brackets 660 are also bolted or screwed to the adjacent ends of front and back door mounts 15. In addition generally "U" shaped double spool brackets 970 could also be attached between the adjacent front vertical frame rails 105 and back vertical frame rails 110 of the ganged cabinets.

Referring specifically to FIG. 21, the cross hatched areas (side cable management pathways 640 and center cable management pathway 650) show the cable management pathways that are created as a result of inset frame structure of the network cabinets 10 when two network cabinets 10 are ganged together. Side cable management pathways 640 are bounded by side panels 300 on the outside and front and back vertical frame rails 105, 110 and front to back support beams 135 on the inside. Center cable management pathway 650 is a larger cable management pathway that is bounded on the left and right by the adjacent front and back vertical frame rails 105, 110 and front to back support beams 135. Hinging front doors 500 outward (as shown in FIG. 21) provides clear access to center cable management pathway 650. Hinging front doors 500 inward provides clear access to the corresponding side cable management pathways 640, which can also be clearly accessed by removing the corresponding side panel 300.

What is claimed is:

1. A network cabinet, comprising:
a base member comprising a pair of side to side base beams and a pair of front to back base beams, the side to side base beams positioned between and perpendicular to the front to back base beams; a vertical frame rail member connected to the base member and positioned spaced apart, along at least a portion of a length of the vertical frame rail member, from at least two adjacent sidewalls and a corner of the cabinet formed by the two adjacent sidewalls, wherein each sidewall comprises one of a panel and a door; and at least one finger secured to the vertical frame rail member and extending from the vertical frame rail member.

2. The network cabinet of claim 1, wherein the network cabinet comprises a pair of vertical frame rail members, the vertical frame rail members and one of the sidewalls defining a cable management pathway such that the finger does not obstruct the cable management pathway.

* * * * *

UNITED STATES PATENT AND TRADEMARK OFFICE
CERTIFICATE OF CORRECTION

PATENT NO. : 7,495,169 B2 Page 1 of 1
APPLICATION NO. : 11/876023
DATED : February 24, 2009
INVENTOR(S) : Samuel J. Adducci et al.

It is certified that error appears in the above-identified patent and that said Letters Patent is hereby corrected as shown below:

- Column 1, Line 14, the word "Particularly" should not be capitalized.

- Column 7, Line 45, "placed oil the top" should read --placed on the top--.

- Column 11, Line 54, "lever aim" should read --lever arm--.

- Column 13, Line 42, "lever slops 555 are move" should read --lever stops 555 are moved--.

- Column 14, Line 12, "all overcam latch" should read --an overcam latch--.

- Column 15, Line 17, "masking a the portion" should read --masking the portion--.

Signed and Sealed this

Twenty-third Day of June, 2009

JOHN DOLL
*Acting Director of the United States Patent and Trademark Office*